US008957468B2

(12) United States Patent
Uochi

(10) Patent No.: US 8,957,468 B2
(45) Date of Patent: Feb. 17, 2015

(54) VARIABLE CAPACITOR AND LIQUID CRYSTAL DISPLAY DEVICE

(75) Inventor: Hideki Uochi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 155 days.

(21) Appl. No.: 13/285,367

(22) Filed: Oct. 31, 2011

(65) Prior Publication Data
US 2012/0113341 A1 May 10, 2012

(30) Foreign Application Priority Data

Nov. 5, 2010 (JP) ................................. 2010-249074

(51) Int. Cl.
*H01L 29/93* (2006.01)
*G02F 1/1362* (2006.01)
(Continued)

(52) U.S. Cl.
CPC .......... *H01L 29/93* (2013.01); *G02F 1/136213* (2013.01); *H01L 27/1225* (2013.01); *H01L 27/1255* (2013.01); *H01L 29/41733* (2013.01)
USPC ...................... 257/312; 349/38; 257/E29.344

(58) Field of Classification Search
CPC ........................... H01L 29/94; H01L 27/0808
USPC ...................... 349/38, 39, 138, 139, 141, 155; 257/312
See application file for complete search history.

(56) References Cited

U.S. PATENT DOCUMENTS 5,369,512 A * 11/1994 Yanai et al. ..................... 349/38
5,731,856 A    3/1998 Kim et al.
5,744,864 A    4/1998 Cillessen et al.
(Continued)

FOREIGN PATENT DOCUMENTS

EP    1 737 044 A1    12/2006
EP    2 226 847 A2    9/2010
(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
(Continued)

*Primary Examiner* — Edward Glick
*Assistant Examiner* — Sang V Nguyen
(74) *Attorney, Agent, or Firm* — Fish & Richardson P.C.

(57) ABSTRACT

A variable capacitor with high controllability and stable operation is provided. A liquid crystal display device with low power consumption and excellent display quality is provided. A variable capacitor is formed using two overlapping electrodes of different areas and a substantially intrinsic semiconductor layer formed in contact with one of the electrodes. According to the voltage applied to the electrodes, the semiconductor layer can be considered as a dielectric or a conductor, thereby allowing varying the capacitance of the variable capacitor. The variable capacitor is applied to pixels of a liquid crystal display device configured to switch between a low capacitance and a high capacitance of the variable capacitor in accordance with a moving image display mode and a still image display mode, respectively, whereby a liquid crystal display device with low power consumption and excellent display quality can be realized.

37 Claims, 21 Drawing Sheets

(51) Int. Cl.
*H01L 27/12* (2006.01)
*H01L 29/417* (2006.01)

(56) References Cited

U.S. PATENT DOCUMENTS

| | | | |
|---|---|---|---|
| 5,793,074 A | 8/1998 | Choi et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,947,102 B2 * | 9/2005 | den Boer et al. | 349/12 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,379,054 B2 * | 5/2008 | Lee | 345/173 |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0267150 A1 * | 11/2006 | Estes | 257/595 |
| 2006/0274011 A1 * | 12/2006 | Igarashi et al. | 345/94 |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0030221 A1 * | 2/2007 | Pak et al. | 345/87 |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0237677 A1 * | 10/2008 | Futatsugi | 257/312 |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296567 A1 * | 12/2008 | Irving et al. | 257/43 |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0128724 A1 * | 5/2009 | Chen et al. | 349/39 |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0279007 A1 * | 11/2009 | Shih et al. | 349/37 |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0089477 A1 * | 4/2011 | Wernersson | 257/312 |

FOREIGN PATENT DOCUMENTS

| | | | | |
|---|---|---|---|---|
| JP | 60-198861 A | 10/1985 | | |
| JP | 63-210022 A | 8/1988 | | |
| JP | 63-210023 A | 8/1988 | | |
| JP | 63-210024 A | 8/1988 | | |
| JP | 63-215519 A | 9/1988 | | |
| JP | 63-239117 A | 10/1988 | | |
| JP | 63-265818 A | 11/1988 | | |
| JP | 05-027264 A | 2/1993 | | |
| JP | 05-251705 A | 9/1993 | | |
| JP | 08-264794 A | 10/1996 | | |
| JP | 11-505377 A | 5/1999 | | |
| JP | 2000-044236 A | 2/2000 | | |
| JP | 2000-150900 A | 5/2000 | | |
| JP | 2002-076356 A | 3/2002 | | |
| JP | 2002-289859 A | 10/2002 | | |
| JP | 2003-086040 A | 3/2003 | | |
| JP | 2003-086808 A | 3/2003 | | |
| JP | 2004-103957 A | 4/2004 | | |
| JP | 2004-273614 A | 9/2004 | | |
| JP | 2004-273732 A | 9/2004 | | |
| JP | 2010-040815 | * | 2/2010 | H01L 29/786 |
| WO | 2004/114391 A1 | 12/2004 | | |

OTHER PUBLICATIONS

Asaoka, Yet al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

(56) References Cited

OTHER PUBLICATIONS

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al.. "Novel Top-Gate Zinc Oxide Thin-Film Transistors (ZnO TFTs) for AMLCDs," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda., T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,YBFE2O4, and YB2FE3O7 Types of Structures for Compounds in the IN2O3 and SC2O3—A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.
Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "Suftla Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

(56) References Cited

OTHER PUBLICATIONS

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park. J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al.. "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Toshio Kamiya et al.; "Carrier transport properties and electronic structures of amorphous oxide semiconductors: the present status"; Kotai Butsuri; 2009; pp. 621-633; vol. 44, Issue 9 (with English abstract and full English translation).

\* cited by examiner

FIG. 19A
FIG. 19B
FIG. 19C
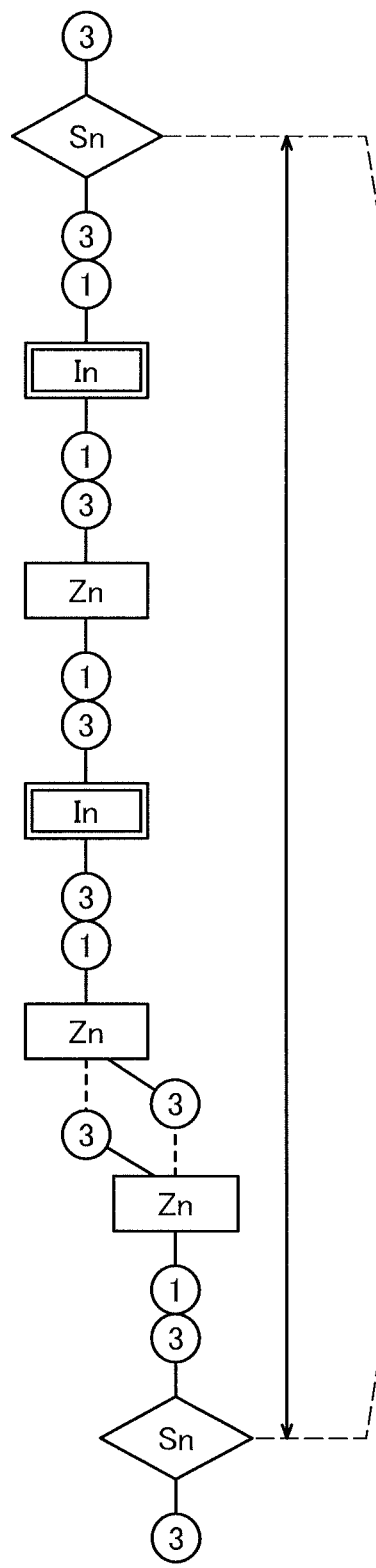
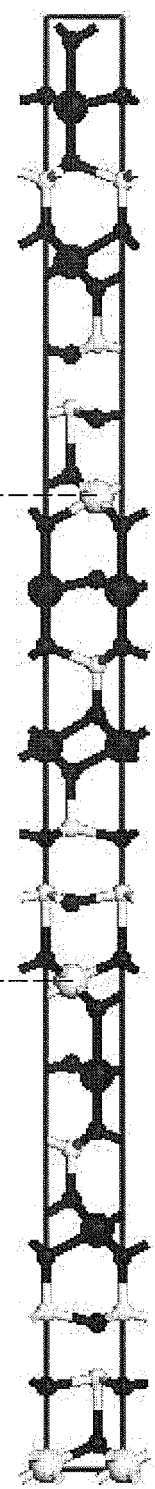
- In
- Sn
- Zn
- O

- In
- Ga
- Zn
- O

● In
○ Ga or Zn
● O

● In
○ Ga
○ Zn
● O

VARIABLE CAPACITOR AND LIQUID CRYSTAL DISPLAY DEVICE

BACKGROUND OF THE INVENTION

1. Field of the Invention

The present invention relates to a variable capacitor whose capacitance value can be controlled by voltage and a liquid crystal display device including the variable capacitor.

In this specification, a semiconductor device means all types of devices which can function by utilizing semiconductor characteristics, and a semiconductor circuit, a memory device, an imaging device, a display device, an electro-optical device, an electronic device, and the like are all semiconductor devices.

2. Description of the Related Art

As an element whose capacitance value can be controlled by voltage, a variable capacitor which is called a variable capacitance diode, a variable reactor, a varicap, and the like is known. As a variable capacitor, a pn-junction variable capacitor and an MIS (Metal-Insulator-Semiconductor) variable capacitor (also referred to as an MOS variable capacitor) are known.

A pn-junction variable capacitor utilizes a property that, when a reverse voltage is applied thereto, the thickness of a depletion layer which is generated at a pn junction interface varies depending on the level of the applied voltage, and variation in the capacitance value thereof can be adjusted by adjusting the impurity concentrations of p-type and n-type semiconductor layers.

In an MIS variable capacitor, an insulating layer and an electrode are formed over a semiconductor substrate, and the thickness of a depletion layer which is generated at a surface of the semiconductor substrate is controlled by the voltage applied to the electrode, whereby the capacitance value is varied. Although the capacitance ratio of the MIS variable capacitor cannot be made as large as that of the pn-junction variable capacitor, the MIS variable capacitor has an advantage that it can be formed at the same time as an MIS transistor and therefore can be highly integrated easily.

However, also in the MIS variable capacitor, the impurity concentration in the semiconductor substrate which is p-type or n-type needs to be controlled appropriately in order to deplete the semiconductor substrate. There is also a problem in that, although the capacitance value of the MIS (MOS) variable capacitor can be changed obviously depending on whether a positive bias voltage or a negative bias voltage is applied to the electrode in the case where a signal supplied to the electrode is a high-frequency signal with a frequency of 1 kHz or higher, the capacitance value cannot be changed obviously in the case where the frequency of the signal is lowered, and especially in the case of a low-frequency signal with a frequency of 100 Hz or lower or a direct-current signal, the capacitance value hardly changes regardless of whether a positive bias voltage or a negative bias voltage is applied to the electrode.

As an example of the MIS variable capacitor, a variable capacitor disclosed in Patent Document 1 can be given. The variable capacitor disclosed in Patent Document 1 has a structure in which a p-type silicon layer or an n-type silicon layer, and an insulating layer are provided between two electrodes having different areas and the p-type silicon layer or the n-type silicon layer is depleted by a voltage applied between the electrodes, whereby two different capacitance values are realized.

REFERENCE

Patent Document

[Patent Document 1] Japanese Published Patent Application No. H5-27264

SUMMARY OF THE INVENTION

It is known that when an electrode is provided over a p-type silicon layer with an insulating layer interposed therebetween and a positive direct-current voltage or a positive low-frequency voltage is applied to the electrode, the p-type silicon layer is depleted and then an inversion layer is formed in which the p-type silicon layer becomes n-type. It is also known that when an electrode is provided over an n-type silicon layer with an insulating layer interposed therebetween and a negative direct-current voltage or a negative low-frequency voltage is applied to the electrode, the n-type silicon layer is depleted and then an inversion layer is formed in which the n-type silicon layer becomes p-type. In general, a low-frequency voltage having a frequency equivalent to the scan frequency of a scan line (about 60 Hz) or a fixed voltage (direct-current voltage) is applied to a storage capacitor used in a pixel of a liquid crystal display device.

Accordingly, the capacitance value of the variable capacitor disclosed in Patent Document 1 varies depending on the voltage applied between the electrodes, as shown by CV (capacitance voltage) characteristic 401 in FIG. 3. In FIG. 3, the horizontal axis represents a potential applied to the electrode which is formed adjacent to the semiconductor layer with the insulating layer interposed therebetween in the case where the potential of the semiconductor layer is set to a reference potential (0 V), and the vertical axis represents the capacitance value.

The CV characteristic 401 in FIG. 3 is a CV characteristic in the case where a p-type silicon layer is used as the semiconductor layer. When the potential of the semiconductor layer is set to the reference potential (0 V) and the potential of the electrode is changed from a negative potential to a positive potential, the p-type silicon layer is gradually depleted and the capacitance value decreases from A to B. B is the minimum capacitance value obtained when the p-type silicon layer is depleted. After that, an inversion layer is formed in the p-type silicon layer in which the p-type silicon layer becomes n-type, whereby the capacitance value increases from B to A'. Such CV characteristics are widely known as CV characteristics of an MIS (MOS) variable capacitor.

CV characteristics in the case where an n-type silicon layer is used as the semiconductor layer can be described by interchanging p-type and n-type and positive and negative in the above description.

When the impurity concentration in the p-type or n-type silicon layer is high, the p-type or n-type silicon layer is less likely to be depleted, so that the capacitor cannot function as a variable capacitor; thus, the impurity concentration in the silicon layer needs to be controlled appropriately. Further, when the impurity concentration varies among elements, the capacitance value B and a voltage at which the capacitance value becomes B tend to vary among the elements.

Accordingly, when a semiconductor layer which becomes n-type or p-type depending on an electric field applied thereto is used as the semiconductor layer of the above variable capacitor, a voltage range within which the capacitance value B is realized is narrow, so that it is difficult to keep the capacitance value B. Therefore, when such a variable capacitor is used as a storage capacitor of a liquid crystal display device, voltage applied to the storage capacitor varies owing to variation in an image signal supplied to a pixel electrode; thus, it is difficult to keep the capacitance value B.

It is an object of one embodiment of the present invention to provide a semiconductor device with high reliability.

It is another object of one embodiment of the present invention to provide a semiconductor device capable of high-speed operation.

It is another object of one embodiment of the present invention to provide a semiconductor device with low power consumption.

It is another object of one embodiment of the present invention to provide a semiconductor device with excellent display quality.

It is another object of one embodiment of the present invention to provide a semiconductor device allowing high productivity.

By using a semiconductor which becomes n-type or i-type or becomes p-type or i-type depending on an electric field applied thereto, a variable capacitor with stable operation can be realized. A stack of an insulating layer as a dielectric layer and a layer of the above semiconductor is provided between a first electrode and a second electrode included in the variable capacitor. When the first electrode is provided on the dielectric layer side and the second electrode is provided on the semiconductor layer side, an area C2 where the first electrode, the semiconductor layer, and the second electrode overlap with one another is made smaller than an area C1 where the first electrode and the semiconductor layer overlap with each other.

As an example of the semiconductor material described above, an oxide semiconductor can be given. For example, an In—Ga—Zn-based oxide semiconductor can be regarded as n-type, i-type, or substantially i-type depending on an electric field applied thereto.

When a semiconductor which becomes n-type or i-type is used for the semiconductor layer of the variable capacitor having the above structure, the capacitance value becomes F1 which is determined by the area C1 in the case where a positive potential is supplied to the first electrode, and the capacitance value becomes F2 which is determined by the area C2 in the case where a negative potential is supplied to the first electrode.

When the potential of the first electrode is a positive potential or a negative potential, the capacitance value F1 or the capacitance value F2 hardly varies even when the potential of the first electrode varies; thus, the capacitance value F1 and the capacitance value F2 can be stably obtained with high controllability.

For example, when a variable capacitor disclosed in this specification is applied to a storage capacitor of a liquid crystal display device, the capacitance value can be made small in moving image display in which an image is frequently rewritten, and the capacitance value can be made large in still image display in which an image is less frequently rewritten. That is, the storage capacitor can have optimal capacitance values for moving image display and still image display; thus, a liquid crystal display device with excellent display quality, low power consumption, and high reliability can be realized.

An oxide semiconductor can also be applied to a semiconductor layer (active layer) where a channel of a transistor is formed. Using an oxide semiconductor for the active layer can realize a semiconductor device with low power consumption and high reliability.

Note that an oxide semiconductor which is highly purified (purified OS) by reduction of an impurity such as moisture or hydrogen which serves as an electron donor (donor) can be made to be an i-type (intrinsic) oxide semiconductor or an oxide semiconductor extremely close to an i-type semiconductor (a substantially i-type oxide semiconductor) by supplying oxygen to the oxide semiconductor to reduce oxygen deficiency in the oxide semiconductor. A transistor including the i-type or substantially i-type oxide semiconductor has a characteristic of very small off-state current. Specifically, the hydrogen concentration in the highly purified oxide semiconductor which is measured by secondary ion mass spectrometry (SIMS) is less than or equal to $5 \times 10^{19}/cm^3$, preferably less than or equal to $5 \times 10^{18}/cm^3$, further preferably less than or equal to $5 \times 10^{17}/cm^3$, still further preferably less than or equal to $1 \times 10^{16}/cm^3$. In addition, the carrier density of the oxide semiconductor layer, which is measured by Hall effect measurement, is less than $1 \times 10^{14}/cm^3$, preferably less than $1 \times 10^{12}/cm^3$, further preferably less than $1 \times 10^{11}/cm^3$. Furthermore, the band gap of the oxide semiconductor is 2 eV or more, preferably 2.5 eV or more, further preferably 3 eV or more. When the oxide semiconductor which has been highly purified by sufficiently reducing the concentration of impurities such as moisture or hydrogen and in which oxygen deficiency is reduced is used for the semiconductor layer, the off-state current of the transistor can be reduced.

The analysis of the hydrogen concentration in the oxide semiconductor by SIMS is described here. It is known that it is difficult to obtain data in the proximity of a surface of a sample or in the proximity of an interface between stacked films formed using different materials by the SIMS analysis in principle. Thus, in the case where the distribution of the hydrogen concentration in the thickness direction of a film is analyzed by SIMS, the average value of the hydrogen concentration in a region of the film where almost the same value can be obtained without significant variation is employed as the hydrogen concentration. Further, in the case where the thickness of the film is small, a region where almost the same value can be obtained cannot be found in some cases due to the influence of the hydrogen concentration of an adjacent film. In this case, the maximum value or the minimum value of the hydrogen concentration of a region where the film is provided is employed as the hydrogen concentration of the film. Furthermore, in the case where a maximum value peak and a minimum value valley do not exist in the region where the film is provided, the value of the inflection point is employed as the hydrogen concentration.

One embodiment of the present invention is a variable capacitor including a first electrode, a second electrode, and an insulating layer and an oxide semiconductor layer between the first electrode and the second electrode. In the variable capacitor, the first electrode is provided in contact with the insulating layer, and the second electrode is provided in contact with the oxide semiconductor layer. An area where the first electrode and the oxide semiconductor layer overlap with each other is larger than an area where the first electrode, the oxide semiconductor layer, and the second electrode overlap with one another.

Another embodiment of the present invention is a liquid crystal display device including a display panel including a driver circuit portion, a capacitor line driver circuit, and a variable capacitor in a pixel portion; a signal generation circuit configured to generate a control signal which drives the driver circuit portion and an image signal to be supplied to the pixel portion; a memory circuit which stores image signals corresponding to frame periods; a comparison circuit which detects a difference between image signals of successive frame periods among the image signals stored corresponding to the frame periods in the memory circuit; a selection circuit which selects and outputs the image signals of the successive frame periods when a difference is detected in the comparison circuit; and a display control circuit which supplies a signal which sets a capacitance value of the variable capacitor to a first capacitance value from the capacitor line driver circuit when a difference is detected in the comparison circuit, and supplies a signal which sets a capacitance value of the variable capacitor to a second capacitance value from the capacitor line driver circuit and stops supply of the control signal to the driver circuit portion when a difference is not detected in the comparison circuit.

The first capacitance value is made smaller than the second capacitance value, so that a liquid crystal display device with excellent display quality, low power consumption, and high reliability can be realized.

According to one embodiment of the present invention, a semiconductor device with high reliability can be provided.

According to one embodiment of the present invention, a semiconductor device capable of high-speed operation can be provided.

According to one embodiment of the present invention, a semiconductor device with low power consumption can be provided.

According to one embodiment of the present invention, a semiconductor device with excellent display quality can be provided.

According to one embodiment of the present invention, a semiconductor device with high productivity can be provided.

One embodiment of the present invention can achieve at least one of the above objects.

BRIEF DESCRIPTION OF THE DRAWINGS

FIGS. 19A to 19C illustrate a crystal structure of an oxide material.

DETAILED DESCRIPTION OF THE INVENTION

Figure 1A:
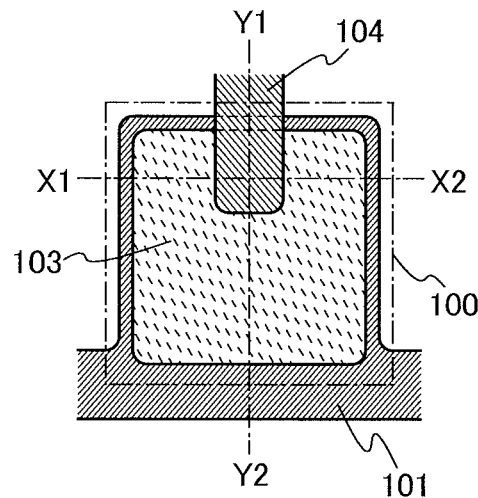
FIGS. 1A to 1C are a top view and cross-sectional views illustrating one embodiment of a variable capacitor.

Embodiments and examples will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments and examples. Note that in the structures of the invention described below, the same portions or portions having similar functions are denoted by the same reference numerals in different drawings, and description of such portions is not repeated.

In addition, in this specification and the like, ordinal numbers such as "first", "second", and "third" are used in order to avoid confusion among components, and the terms do not limit the components numerically.

Note that the position, size, range, or the like of each structure illustrated in drawings and the like is not accurately represented in some cases for easy understanding. Therefore, the disclosed invention is not necessarily limited to the position, size, range, or the like as disclosed in the drawings and the like.

A transistor is one kind of semiconductor elements and can amplify current or voltage and perform a switching operation for controlling conduction or non-conduction, for example. A transistor in this specification includes an insulated-gate field effect transistor (IGFET) and a thin film transistor (TFT).

Functions of a "source" and a "drain" of a transistor are sometimes replaced with each other when a transistor of opposite polarity is used or when the direction of current flowing is changed in circuit operation, for example. Therefore, the terms "source" and "drain" can be used to denote the drain and the source, respectively, in this specification.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

Embodiment 1

A structure and operation of a variable capacitor disclosed in this specification will be described with reference to FIGS.

Figure 1B:
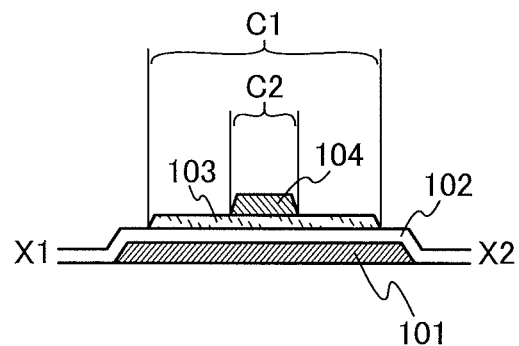
Figure 1C:
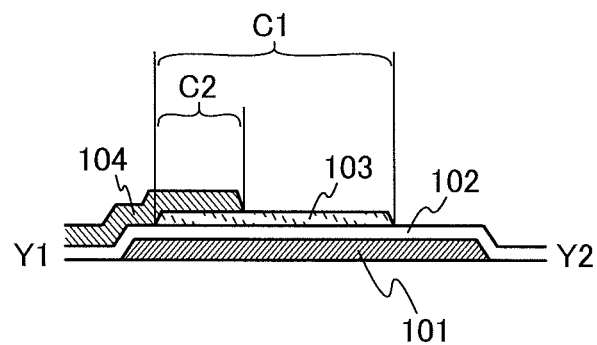
Figure 2A:
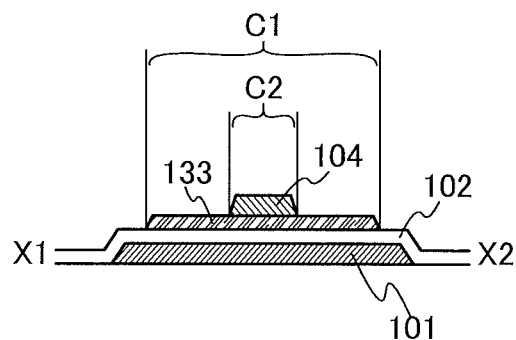
FIGS. 2A to 2C show operation of a variable capacitor.
Figure 2B:
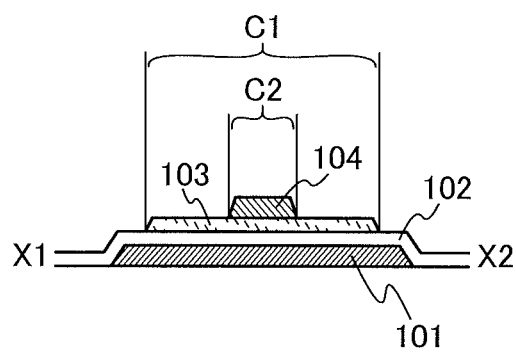
Figure 2C:
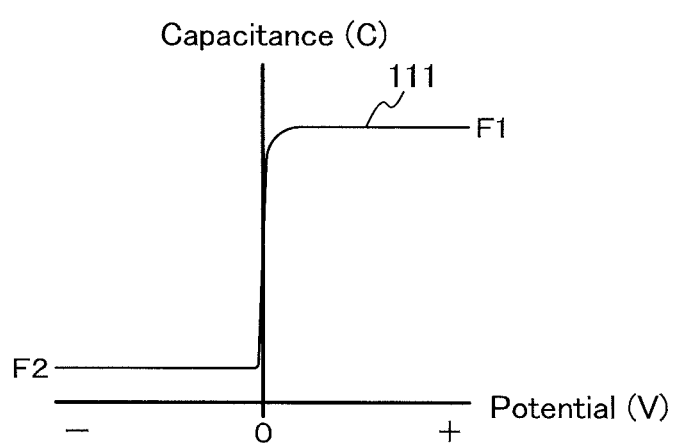
Figure 3:
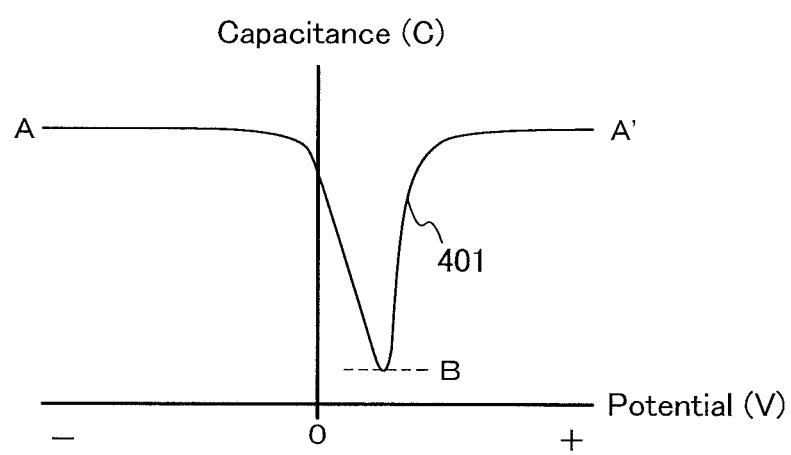
FIG. 3 shows CV characteristic of an MIS variable capacitor in which a p-type silicon layer is used as a semiconductor layer.

1A to 1C and FIGS. 2A to 2C. FIG. 1A is a top view of a variable capacitor 100, and FIG. 1B is a cross-sectional view taken along chain line X1-X2 in FIG. 1A. FIG. 1C is a cross-sectional view taken along chain line Y1-Y2 in FIG. 1A.

In the variable capacitor 100 in FIGS. 1A to 1C, an insulating layer 102 is formed over a first electrode 101, a semiconductor layer 103 is formed over the insulating layer 102, and a second electrode 104 is formed over the semiconductor layer 103. An area where the first electrode 101 and the semiconductor layer 103 overlap with each other is denoted by C1, and an area where the first electrode 101, the semiconductor layer 103, and the second electrode 104 overlap with one another is denoted by C2.

In FIGS. 1A to 1C, the semiconductor layer 103 is formed so as not to extend beyond edges of the first electrode 101; however, the semiconductor layer 103 may be formed so as to extend beyond the edges of the first electrode 101.

For the semiconductor layer 103, a semiconductor material which becomes n-type or i-type (intrinsic) depending on an electric field applied thereto or a semiconductor material which becomes p-type or i-type depending on an electric field applied thereto is used. As an example of the semiconductor material described above, an oxide semiconductor can be given.

For example, an In—Ga—Zn-based oxide semiconductor can be regarded as n-type, i-type, or substantially i-type depending on an electric field applied thereto.

The insulating layer 102 can be formed using silicon oxide, silicon nitride, silicon oxynitride, silicon nitride oxide, aluminum oxide, aluminum nitride, aluminum oxynitride, aluminum nitride oxide, tantalum oxide, gallium oxide, yttrium oxide, hafnium oxide, hafnium silicate ($HfSi_xO_y$ ($x>0$, $y>0$)), hafnium silicate to which nitrogen is added, hafnium aluminate to which nitrogen is added, or the like. The insulating layer 102 is not limited to a single layer and may be a stack of different layers. For example, the insulating layer 102 may be formed in the following manner a silicon nitride layer ($SiN_y$ ($y>0$)) is formed by plasma CVD as an insulating layer A and a silicon oxide layer ($SiO_x$ ($x>0$)) is stacked over the insulating layer A as an insulating layer B.

The first electrode 101 and the second electrode 104 can be formed with a single-layer structure or a layered structure using a metal material such as molybdenum (Mo), titanium (Ti), tungsten (W), tantalum (Ta), aluminum (Al), copper (Cu), chromium (Cr), or magnesium (Mg) or an alloy material containing any of these materials as a main component.

Note that an ohmic contact needs to be formed between the second electrode 104 and the semiconductor layer 103 so that carriers are favorably transported between the second electrode 104 and the semiconductor layer 103. An ohmic contact between a semiconductor and a metal can be realized by connecting a semiconductor material to a metal material whose work function is smaller than or equal to the electron affinity of the semiconductor material. However, in the case of using an inorganic semiconductor material such as silicon, whose electron affinity is smaller than the work function of a metal material generally used for electrodes and wirings, an ohmic contact layer needs to be additionally provided between the semiconductor material and the metal material.

Meanwhile, when an In—Ga—Zn-based oxide semiconductor is used for the semiconductor layer 103, for example, since the electron affinity of the In—Ga—Zn-based oxide semiconductor is about 4.3 eV, an ohmic contact can be realized without additional provision of an ohmic contact layer by using titanium which has a work function of about 4.1 eV for the second electrode 104. In other words, a manufacturing process of a semiconductor device can be simplified; thus, productivity of the semiconductor device can be improved.

Next, operation of the variable capacitor 100 in which an In—Ga—Zn-based oxide semiconductor which is i-type when no electric field is applied is used for the semiconductor layer 103 will be described with reference to FIGS. 2A to 2C. FIGS. 2A and 2B are cross-sectional views taken along chain line X1-X2 in FIG. 1A. An ohmic contact is formed between the semiconductor layer 103 and the second electrode 104.

FIG. 2C shows CV characteristic 111 which describe variation in the capacitance value of the variable capacitor 100 in the case where the potential of the first electrode 101 is varied. In FIG. 2C, the horizontal axis represents the potential of the first electrode 101 in the case where the potential of the second electrode 104 is set to 0 V, and the vertical axis represents the capacitance value.

When the potential of the first electrode 101 becomes higher than or equal to a certain value, the semiconductor layer 103 becomes n-type and becomes an n-type semiconductor layer 133 (see FIG. 2A). Note that unless otherwise specified, a potential at which the semiconductor layer 103 becomes the n-type semiconductor layer 133 and the capacitance value of the variable capacitor 100 begins to increase is referred to as a threshold voltage in this specification.

The CV characteristic 111 in FIG. 2C show the case where the threshold voltage is slightly shifted in a negative direction owing to the relation between the work function of the first electrode 101, and the electron affinity and the band gap of the semiconductor layer 103.

Since the n-type semiconductor layer 133 functions as a conductor, the capacitance value of the variable capacitor 100 becomes the capacitance value F1 which is determined by the area C1 and the thickness and dielectric constant of the insulating layer 102 functioning as a dielectric layer (see FIG. 2C).

The oxide semiconductor used for the semiconductor layer 103 remains i-type even when a negative electric field is applied (see FIG. 2B).

The oxide semiconductor has a wide energy gap of 3.0 eV or more. Moreover, the i-type or substantially i-type oxide semiconductor has a low carrier density (e.g., lower than $1\times10^{12}/cm^3$, or lower than $1.45\times10^{10}/cm^3$) as compared to the carrier density of a general silicon wafer (approximately $1\times10^{14}/cm^3$). Therefore, the i-type or substantially i-type oxide semiconductor can be regarded as an insulator.

Accordingly, in the case where a potential which is lower than the threshold voltage is applied to the first electrode 101, not only the insulating layer 102 but also the semiconductor layer 103 functions as a dielectric layer. Therefore, the capacitance value of the variable capacitor 100 in the case where a potential which is lower than the threshold voltage is applied to the first electrode 101 becomes the capacitance value F2 which is determined by the area C2 and the thickness and dielectric constant of each of the insulating layer 102 and the semiconductor layer 103 functioning as dielectric layers.

As described above, the variable capacitor 100 in which an oxide semiconductor is used for the semiconductor layer 103 is hardly affected by variation in the voltage applied between the electrodes, and when the potential difference between the first electrode 101 and the second electrode 104 is smaller than the threshold voltage, the capacitance value F2 can be kept constant even when the potential of the first electrode 101 varies. Strictly speaking, the thickness and dielectric constant of the dielectric layer of the capacitance value F1 differ from those of the capacitance value F2; however, the capacitance ratio between the capacitance value F1 and the capacitance value F2 can be almost determined by the ratio between the area C1 and the area C2. That is, the capacitance ratio between the capacitance value F1 and the capacitance value F2 can be easily designed and the capacitance values can be switched stably. Thus, a semiconductor device with stable operation and high reliability can be provided. Further, since the capacitance ratio can be determined by the ratio between the area C1 and the area C2, a variable capacitor having a large capacitance ratio can be realized.

In a variable capacitor disclosed in this embodiment, it is not necessary to add an impurity to a semiconductor layer and an ohmic contact layer need not be formed; thus, a semiconductor device can be provided with high productivity.

Note that in this embodiment, the variable capacitor 100 in which the electrode 101, the insulating layer 102, the semiconductor layer 103, and the electrode 104 are stacked in this order from the bottom is described as an example; however, the stacking order may be reversed.

This embodiment can be implemented in appropriate combination with the structures described in the other embodiments.

Embodiment 2

In this embodiment, a structure of a liquid crystal display device, in which whether an image to be displayed is a still image or a moving image is judged and both low power consumption in still image display and improvement in display quality in moving image display are realized, will be described as an example of a semiconductor device including the variable capacitor disclosed in Embodiment 1.

Note that a moving image refers to an image which is recognized as a moving image by human eyes by rapid switching of a plurality of images which are time-divided into a plurality of frames. Specifically, a moving image refers to a series of image signals which are recognized as a moving image with less flicker by human eyes by switching images at least 60 times (60 frames) per second. In contrast, unlike a moving image, a still image refers to image signals which do not change in successive frame periods, for example, in an n-th frame and an (n+1)-th frame though a plurality of images which are time-divided into a plurality of frame periods are switched rapidly.

First, a structure of a liquid crystal display device disclosed in this embodiment will be described with reference to a block diagram in FIG. 4. A liquid crystal display device 1000 described in this embodiment includes a display panel 1001, a signal generation circuit 1002, a memory circuit 1003, a comparison circuit 1004, a selection circuit 1005, and a display control circuit 1006.

The display panel 1001 includes, for example, a driver circuit portion 1007, a capacitor line driver circuit 1011, and a pixel portion 1008. The driver circuit portion 1007 includes a scan line driver circuit 1009A and a signal line driver circuit 1009B. The scan line driver circuit 1009A and the signal line driver circuit 1009B are driver circuits for driving the pixel portion 1008 including a plurality of pixels 1100. The scan line driver circuit 1009A, the signal line driver circuit 1009B, the capacitor line driver circuit 1011, and the pixel portion 1008 may be formed using transistors formed over one substrate.

Alternatively, part or all of the scan line driver circuit 1009A, the signal line driver circuit 1009B, and the capacitor line driver circuit 1011 may be provided over a substrate different from a substrate over which the pixel portion 1008 is formed.

As a display method in the pixel portion 1008, a progressive method, an interlace method, a field-sequential method, or the like can be employed. Further, color elements controlled in a pixel at the time of color display are not limited to three colors: R, G; and B (R, and B correspond to red, green, and blue, respectively). For example, R, G; B, and W (W corresponds to white); R, B, and one or more of yellow, cyan, magenta, and the like; or the like can be used. Further, the sizes of display regions may be different between respective dots of color elements. The present invention is not limited to the application to a display device for color display but can also be applied to a display device for monochrome display.

Here, an example of a structure of the pixel portion 1008 will be described with reference to FIGS. 5A and 5B. The pixel portion 1008 includes m first wirings 1111 (m is an integer greater than or equal to 1) electrically connected to the scan line driver circuit 1009A, n second wirings 1112 (n is an integer greater than or equal to 1) electrically connected to the signal line driver circuit 1009B, and in third wirings 1113 electrically connected to the capacitor line driver circuit 1011. Signals supplied from the scan line driver circuit 1009A, the signal line driver circuit 1009B, and the capacitor line driver circuit 1011 are input to the pixels 1100 through the first wirings 1111, the second wirings 1112, and the third wirings 1113, respectively.

The pixel portion 1008 includes the plurality of pixels 1100 arranged in a matrix of m (rows) and n (columns) A pixel 1100 in an i-th row and a j-th column (i is an integer greater than or equal to 1 and less than or equal to m, and j is an integer greater than or equal to 1 and less than or equal to n) is electrically connected to a first wiring 1111-$i$, a second wiring 1112-$j$, and a third wiring 1113-$i$.

Figure 5A:
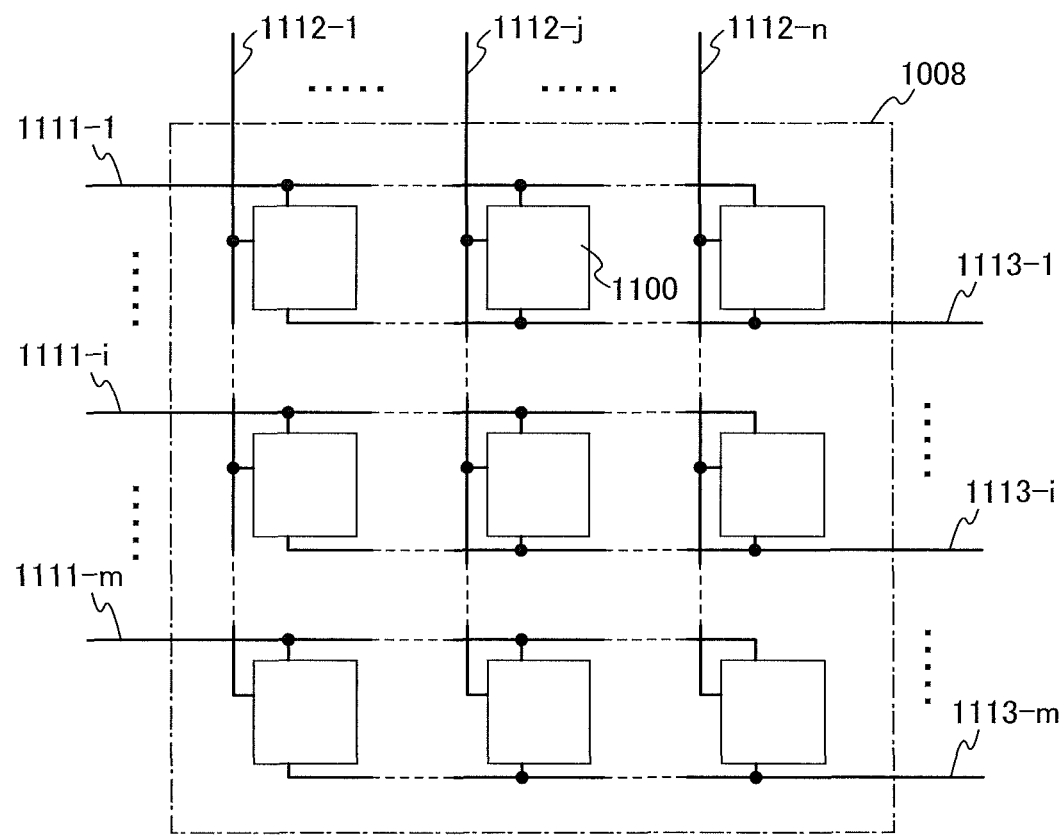
FIGS. 5A and 5B are circuit diagrams illustrating one embodiment of the present invention.
Figure 5B:
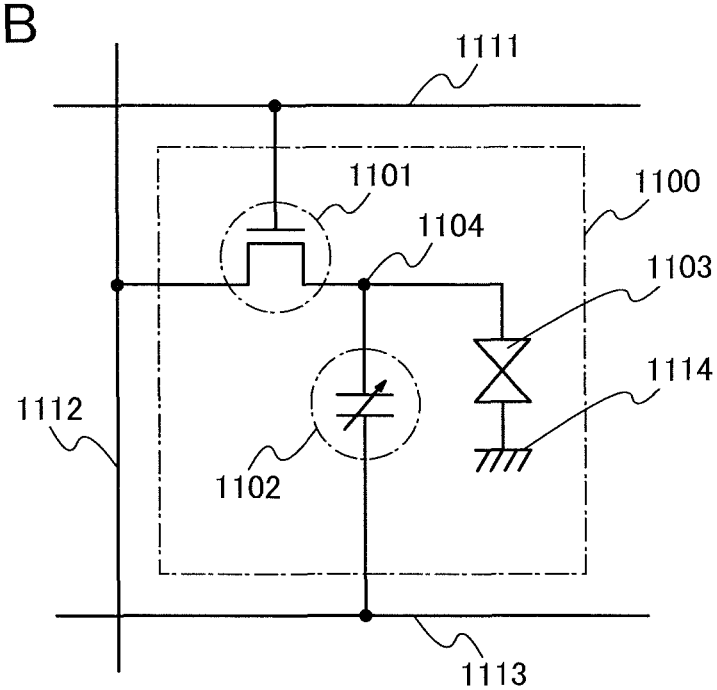

FIG. 5B illustrates an equivalent circuit diagram of the pixel 1100 in the i-th row and the j-th column. The pixel 1100 includes a transistor 1101, a capacitor 1102, and a liquid crystal element 1103. A gate electrode of the transistor 1101 is electrically connected to the first wiring 1111-$i$, one of a source electrode and a drain electrode of the transistor 1101 is electrically connected to the second wiring 1112-$j$, and the other of the source electrode and the drain electrode of the transistor 1101 is electrically connected to a node 1104.

One electrode of the capacitor 1102 is electrically connected to the node 1104, and the other electrode of the capacitor 1102 is electrically connected to the third wiring 1113-$i$. One electrode of the liquid crystal element 1103 is electrically connected to the node 1104, and the other electrode of the liquid crystal element 1103 is electrically connected to an electrode 1114. The potential of the electrode 1114 may be a fixed potential, e.g., 0V, GND, or a common potential.

The variable capacitor 100 disclosed in Embodiment 1 is applied to the capacitor 1102. That is, the first electrode 101 of the variable capacitor 100 is electrically connected to the third wiring 1113-$i$, and the second electrode 104 thereof is electrically connected to the node 1104.

The scan line driver circuit 1009A supplies a signal for turning on/off the transistor 1101 to the first wiring 1111-$i$. The signal line driver circuit 1009B supplies an image signal to the second wiring 1112-$j$. The capacitor line driver circuit 1011 supplies a signal for determining the capacitance value of the capacitor 1102 to the third wiring 1113-$i$.

The transistor 1101 has a function of selecting whether an image signal supplied from the second wiring 1112-$j$ is input to the liquid crystal element 1103. After a signal for turning on the transistor 1101 is supplied to the first wiring 1111-$i$, an image signal is supplied to the liquid crystal element 1103 from the second wiring 1112-$j$ through the transistor 1101. The light transmittance of the liquid crystal element 1103 is controlled depending on the supplied image signal (potential). The capacitor 1102 functions as a storage capacitor for holding the image signal supplied to the liquid crystal element 1103 while the transistor 1101 is in an off state.

Off-state current of the transistor 1101 is one factor by which the size of the storage capacitor is determined. When the size of the storage capacitor is the same and the off-state current is reduced, a voltage can be held for a longer period. Further, by a reduction in the off-state current, the storage capacitor can be made small without changing the holding period.

For a semiconductor layer in which a channel of the transistor 1101 is formed, a single crystal semiconductor, a polycrystalline semiconductor, a microcrystalline semiconductor, an amorphous semiconductor, or the like can be used. Examples of a semiconductor material are silicon, germanium, silicon germanium, silicon carbide, and gallium arsenide.

Alternatively, an oxide semiconductor can be used for the semiconductor layer in which the channel of the transistor 1101 is formed. An oxide semiconductor has an energy gap that is as wide as 3.0 eV to 3.5 eV, and thus has high transmittance with respect to visible light. In a transistor obtained by processing an oxide semiconductor under appropriate conditions, the off-state current at ambient temperature (e.g., 25° C.) can be less than or equal to 100 zA ($1\times10^{-19}$ A), less than or equal to 10 zA ($1\times10^{-20}$ A), and further less than or equal to 1 zA ($1\times10^{-21}$ A). In addition, in terms of realizing a liquid crystal display device with low power consumption, it is preferable to use an oxide semiconductor for the semiconductor layer in which the channel of the transistor 1101 is formed.

As described above, by a reduction in the off-state current of the transistor 1101, the storage capacitor can be made small without changing the holding period. Accordingly, the aperture ratio of the pixel 1100 can be improved and a semiconductor device with excellent display quality can be realized.

By forming the semiconductor layer included in the transistor 1101 and the semiconductor layer included in the capacitor 1102 using the same semiconductor, manufacturing steps can be reduced and a semiconductor device with high productivity can be realized.

In addition, in the case where a display device or the like is manufactured using a transistor with extremely small off-state current, leakage hardly occurs because the off-state current is small, so that display data can be held for a longer period.

Specifically, in a transistor including an oxide semiconductor with a channel width of 10 μm, the off-state current per micrometer of the channel width can be less than or equal to 10 aA/μm ($1\times10^{-17}$ A/μm), and further can be less than or equal to 1 aA/μm ($1\times10^{-18}$ A/μm). When a transistor having an extremely small current in an off state (off-state current) is used as the transistor 1101 included in the pixel 1100, an electrical signal such as an image signal can be held for a longer period. For example, a writing interval of an image signal can be 10 seconds or longer, preferably 30 seconds or longer, further preferably one minute or longer. Thus, in the case of displaying a still image or the like which involves less frequent switching of display, the number of times of signal writing to a pixel can be reduced, so that low power consumption can be achieved.

In order to hold an electrical signal such as an image signal for a longer period, it is also effective to increase the capacitance value of the capacitor 1102 in addition to using a transistor with extremely small off-state current. An increase in the capacitance value of the capacitor 1102 can further extend the holding period of an electrical signal such as an image signal and can further increase the advantageous effect of suppressing power consumption.

Note that in still image display, refresh operation may be performed as appropriate considering a holding rate of a voltage applied to a liquid crystal element during a holding period. For example, refresh operation may be performed at the timing when a voltage is decreased to a predetermined level with respect to the value of voltage (initial value) shortly after a signal is written to a pixel electrode of a liquid crystal element. The predetermined level is preferably set to a voltage at which flicker is not sensed with respect to the initial value. Specifically, it is preferable to perform the refresh operation (rewriting) every time the voltage reaches a voltage which is less than the initial value by 10%, preferably 3%.

During the holding period in still image display, a counter electrode (also referred to as a common electrode) can be put in a floating state. Specifically, a switch may be provided between the counter electrode and a power source for supplying a common potential to the counter electrode. During the writing period, the switch may be turned on and the common potential may be supplied to the counter electrode; after that, during the holding period, the switch may be turned off and the counter electrode may be put in a floating state. It is preferable that the transistor including a high-purity oxide semiconductor be used for the switch.

Figure 4:
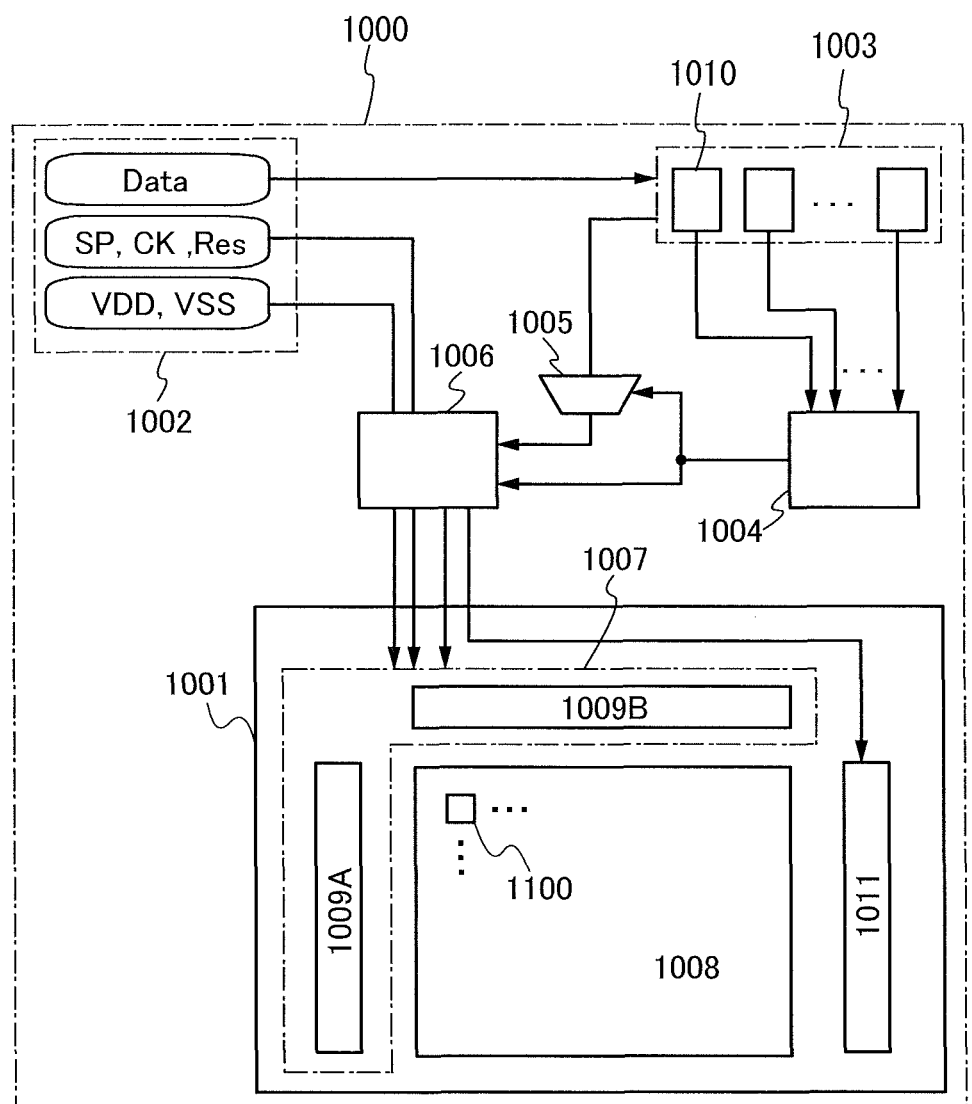
FIG. 4 illustrates an example of a block diagram of a liquid crystal display device.

The signal generation circuit 1002 illustrated in FIG. 4 is a circuit which generates signals for driving the driver circuit portion 1007 and the capacitor line driver circuit 1011. The signal generation circuit 1002 is also a circuit which outputs a signal for driving the driver circuit portion 1007 through a wiring, and is a circuit which outputs an image signal (also called a video voltage, a video signal, or video data) to the memory circuit 1003 through a wiring. In other words, the signal generation circuit 1002 is a circuit for generating and outputting control signals for driving the driver circuit portion 1007 and the capacitor line driver circuit 1011 and an image signal to be supplied to the pixel portion 1008.

Specifically, the signal generation circuit 1002 supplies, as control signals, a high power supply potential VDD and a low power supply potential VSS which are power supply voltages to the scan line driver circuit 1009A, the signal line driver circuit 1009B, and the capacitor line driver circuit 1011, and generates and outputs a start pulse SP and a clock signal CK for the scan line driver circuit 1009A and/or a start pulse SP and a clock signal CK for the signal line driver circuit 1009B. Further, the signal generation circuit 1002 supplies an image signal Data for displaying a moving image or a still image to the memory circuit 1003.

Note that the signal generation circuit 1002 may generate other signals such as an image signal and a latch signal. The signal generation circuit 1002 may output, to the scan line driver circuit 1009A and/or the signal line driver circuit 1009B, a reset signal Res for stopping output of a pulse signal of each driver circuit. Note that each signal may be composed of a plurality of signals such as a first clock signal and a second clock signal.

Note that the high power supply potential VDD is a potential higher than a reference potential, and the low power supply potential VSS is a potential lower than or equal to the reference potential. Note that both the high power supply potential and the low power supply potential are preferably potentials at which a transistor can operate.

Note that in the case where an image signal output from the signal generation circuit 1002 to the memory circuit 1003 is an analog signal, the signal may be switched into a digital signal through an A/D converter or the like to be output to the memory circuit 1003.

The memory circuit 1003 includes a plurality of frame memories 1010 for storing image signals for a plurality of frames. Note that the frame memory may be formed using a memory element such as dynamic random access memory (DRAM) or static random access memory (SRAM).

Note that the number of frame memories 1010 is not particularly limited as long as an image signal can be stored for each frame period. In addition, the image signals stored in the frame memories 1010 are selectively read out by the comparison circuit 1004 and the selection circuit 1005.

The comparison circuit 1004 is a circuit which selectively reads out image signals in successive frame periods stored in the memory circuit 1003, compares the image signals, and detects a difference thereof. In the case where a difference is detected by the comparison of the image signals by the comparison circuit 1004, successive frame periods during which the difference is detected are judged as periods during which a moving image is displayed. On the other hand, in the case where a difference is not detected by the comparison of the image signals by the comparison circuit 1004, successive frame periods during which no difference is detected are judged as periods during which a still image is displayed. In other words, depending on whether a difference is detected by the comparison circuit 1004, whether the image signals in the successive frame periods are image signals for displaying a moving image or image signals for displaying a still image is determined. Note that the difference obtained by the comparison may be set to be detected when the difference exceeds a certain level.

The selection circuit 1005 includes a plurality of switches such as transistors, and is a circuit which selects the image signals from the frame memories 1010 in which the image signals are stored and outputs the image signals to the display control circuit 1006 when it is determined that the image signals are those for displaying a moving image by the difference detection in the comparison circuit 1004. When a difference of image signals between frames compared by the comparison circuit 1004 is not detected, an image displayed in the successive frame periods is a still image, and in that case, image signals of the latter of the successive frame periods are not output to the display control circuit 1006.

The display control circuit 1006 is a circuit which switches supply and stop of the image signal and the control signals such as the high power supply potential VDD, the low power supply potential VSS, the start pulse SP, the clock signal CK, and the reset signal Res to the driver circuit portion 1007. In addition, the display control circuit 1006 supplies a control signal which determines the capacitance value of the capacitor 1102 included in the pixel 1100 through the capacitor line driver circuit 1011.

Specifically, when it is determined that an image to be displayed is a moving image by the comparison circuit 1004, that is, a difference between image signals in successive frame periods is detected, the image signals are supplied from the selection circuit 1005 to the driver circuit portion 1007 through the display control circuit 1006, the control signals are supplied to the driver circuit portion 1007 through the display control circuit 1006, and a control signal for setting the capacitance value of the capacitor 1102 included in the pixel 1100 to a capacitance value for moving image display is supplied through the capacitor line driver circuit 1011.

On the other hand, when it is determined that an image to be displayed is a still image by the comparison circuit 1004, that is, a difference between image signals in successive frame periods is not detected, the image signals are not supplied from the selection circuit 1005, so that the image signals are not supplied to the driver circuit portion 1007 through the display control circuit 1006, and the display control circuit 1006 stops supplying the control signals to the driver circuit portion 1007. At this time, the display control circuit 1006 supplies a control signal for setting the capacitance value of the capacitor 1102 included in the pixel 1100 to a capacitance value for still image display through the capacitor line driver circuit 1011.

Note that in the case where it is determined that the image to be displayed is a still image, when the period during which the image is a still image is short, supply of the high power supply potential VDD and the low power supply potential VSS among the control signals is not necessarily stopped. Thus, an increase in power consumption due to frequent stop and start of supply of the high power supply potential VDD and the low power supply potential VSS can be reduced, which is preferable.

It is preferable that the supply of the image signals and the control signals be stopped during a period in which the image signal can be held in each pixel in the pixel portion 1008, and the display control circuit 1006 may have a structure which can again supply the image signals and the control signals which the display control circuit 1006 supplies before, so that the image signals are supplied again after the holding period of each pixel.

As described above, the capacitance of the capacitor 1102 is preferably large in still image display. On the other hand, in moving image display, since an image is rewritten 60 times or more per second, image signals cannot be surely held during one writing period when the capacitance of the capacitor 1102 is large, which leads to degradation in display quality. Accordingly, in moving image display, the capacitance of the capacitor 1102 needs to be made small in accordance with the length of a rewrite period. In particular, in the case where a moving image is displayed by a field-sequential method, an image is rewritten 180 times or more per second; thus, the capacitance of the capacitor 1102 needs to be made much smaller.

When a capacitor with a large capacitance value for still image display and a capacitor with a small capacitance value for moving image display are formed in one pixel, the aperture ratio is decreased owing to an increase in the area occupied by the capacitor, which causes degradation in display quality of the liquid crystal display device. In the liquid crystal display device described in this embodiment, the variable capacitor disclosed in Embodiment 1 is used as the capacitor 1102, whereby different capacitance values can be realized with high controllability without an increase in the area occupied by the capacitor 1102.

Next, operation of the capacitor 1102 in a still image display period or a moving image display period will be described.

During the still image display period, a potential for setting the capacitance value of the capacitor 1102 to the capacitance value F1 is supplied from the capacitor line driver circuit 1011 to the third wiring 1113 (see FIG. 2C). In this case, the potential supplied to the third wiring 1113 is higher than a potential obtained by adding the threshold voltage to the maximum potential of an image signal.

In this manner, even when potentials which vary depending on image signals are supplied to the node 1104, the potential of the third wiring 1113 can always be higher than the threshold voltage when the potential of the node 1104 is used as a reference potential. Thus, even when potentials which vary depending on image signals are supplied to the node 1104, the capacitance value of the capacitor 1102 can be set to the capacitance value F1.

During the moving image display period, a potential for setting the capacitance value of the capacitor 1102 to the capacitance value F2 is supplied from the capacitor line driver circuit 1011 to the third wiring 1113 (see FIG. 2C). In this case, the potential supplied to the third wiring 1113 is lower than a potential obtained by adding the threshold voltage to the minimum potential of an image signal. The potential supplied to the third wiring 1113 is preferably a potential which is lower than the minimum potential of the image signal.

In this manner, even when potentials which vary depending on image signals are supplied to the node 1104, the potential of the third wiring 1113 can always be lower than the threshold voltage when the potential of the node 1104 is used as a reference potential. Thus, even when potentials which vary depending on image signals are supplied to the node 1104, the capacitance value of the capacitor 1102 can be set to the capacitance value F2.

During the still image display period, the capacitance value of the capacitor 1102 is made large, whereby the number of times of signal writing to a pixel can be reduced; thus, power consumption can be reduced. During the moving image display period, the capacitance value of the capacitor 1102 is made small, so that high-speed operation is possible.

The variable capacitor disclosed in Embodiment 1 is used as the storage capacitor, whereby different capacitance values can be realized with high controllability without an increase in the area occupied by the capacitor. The capacitance value of the storage capacitor is optimized for moving image display and still image display, whereby a liquid crystal display device with low power consumption and excellent display quality can be realized.

This embodiment can be implemented in appropriate combination with the structures described in the other embodiments.

Embodiment 3

Figure 6A:
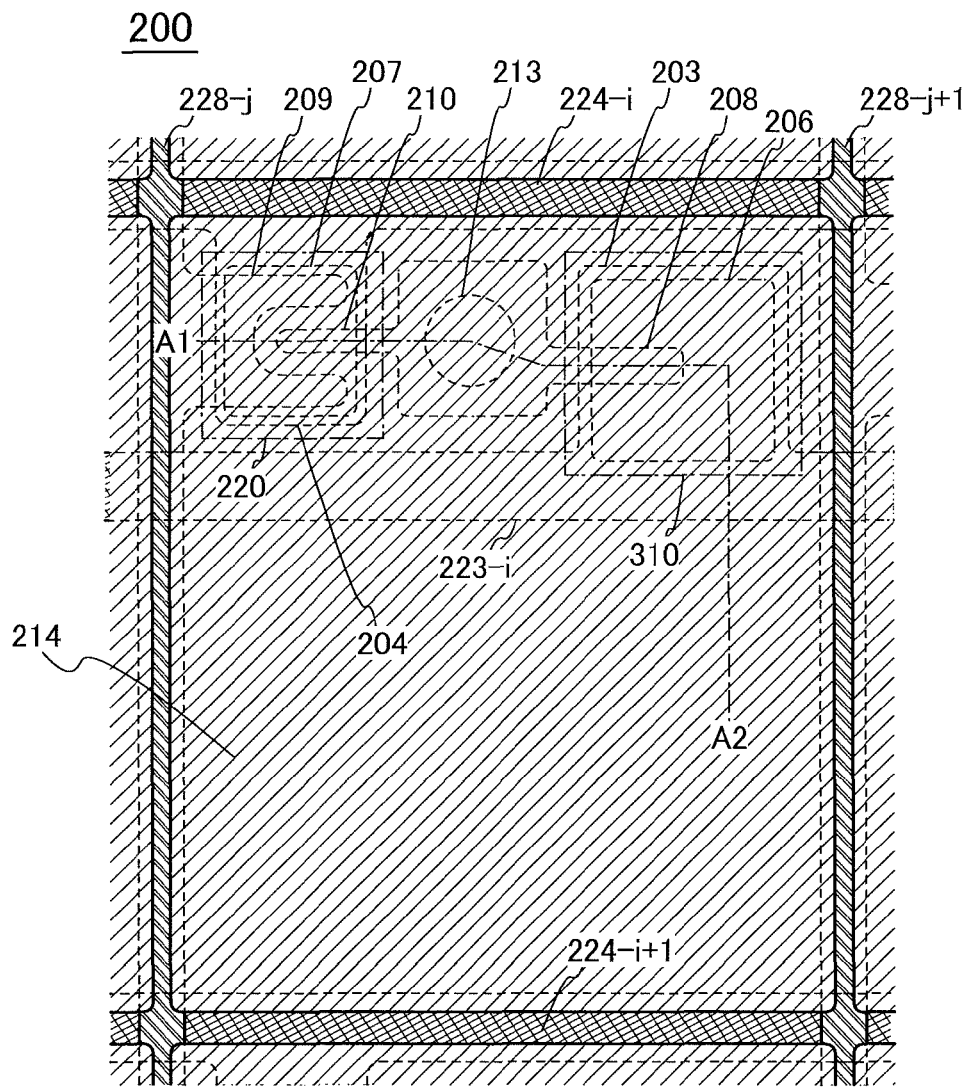
FIGS. 6A and 6B are a top view and a cross-sectional view illustrating one embodiment of the present invention.
Figure 6B:
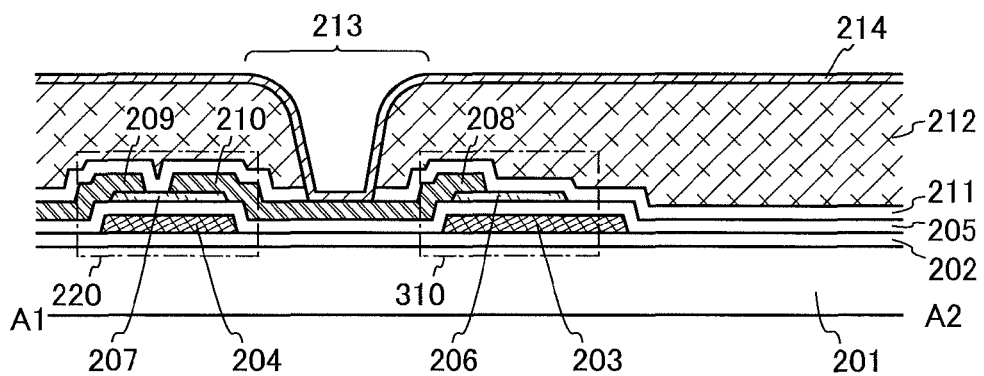
Figure 7:
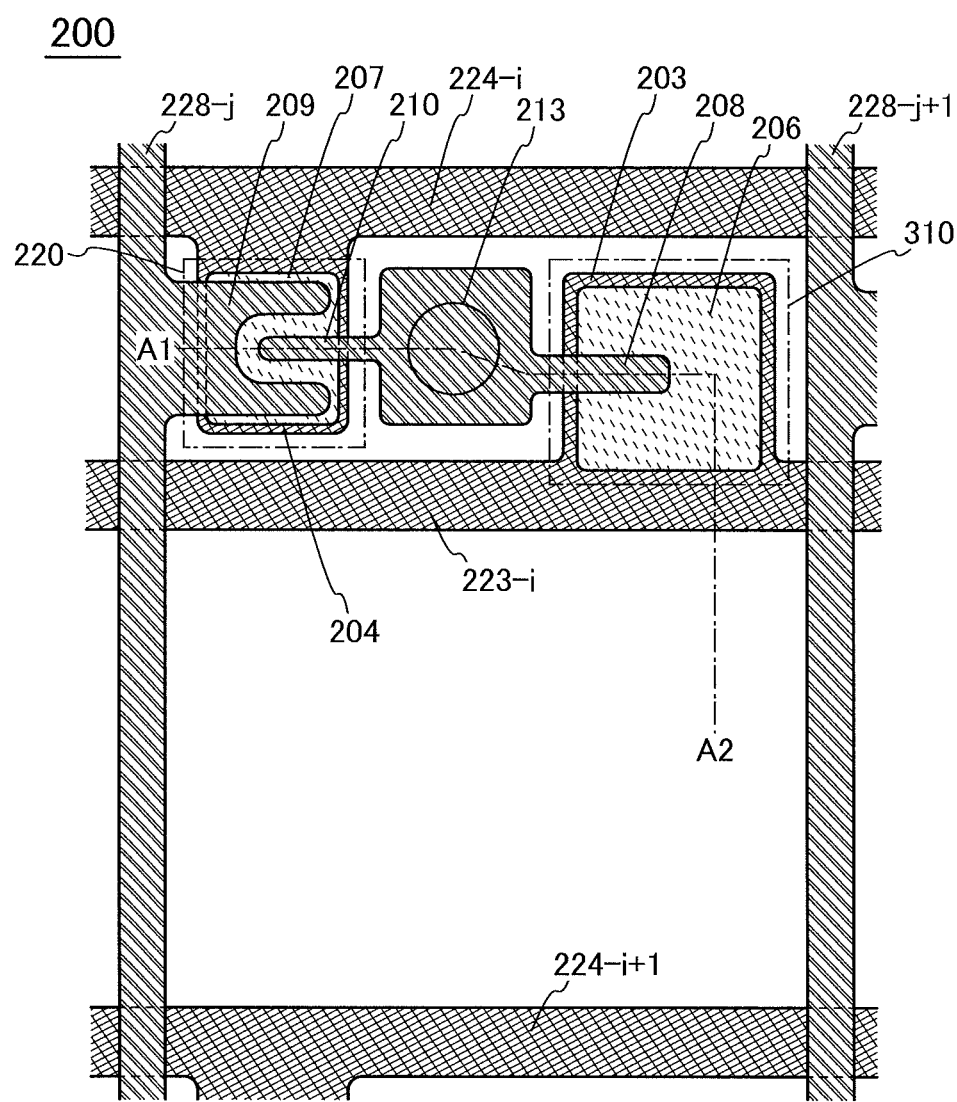
FIG. 7 is a top view illustrating one embodiment of the present invention.

In this embodiment, a pixel structure and a manufacturing method of the liquid crystal display device disclosed in Embodiment 2 will be described with reference to FIGS. 6A and 6B, FIG. 7, FIGS. 8A and 8B, FIGS. 9A to 9D, and FIGS. 10A and 10B. FIG. 6A is a top view illustrating a plan structure of a pixel 200 which can be applied to the pixel 1100 in FIGS. 5A and 5B. FIG. 6B is a cross-sectional view illustrating a stacked structure of a portion indicated by chain line A1-A2 in FIG. 6A. FIG. 7 illustrates a state where a pixel electrode 214 is removed from FIG. 6A for easy understanding of the plan structure illustrated in FIG. 6A.

In a pixel described in this embodiment, a transistor 220 and a capacitor 310 are formed over a substrate 201 with an insulating layer 202 interposed therebetween. In the transistor 220, an insulating layer 205 is formed over a gate electrode 204, and a semiconductor layer 207 is formed over the insulating layer 205. A source electrode 209 and a drain electrode 210 are formed over the semiconductor layer 207, and an insulating layer 211 is formed over the source electrode 209 and the drain electrode 210 so as to be in contact with part of the semiconductor layer 207. The transistor 220 is a bottom-gate transistor in which a channel formation region is provided above a gate electrode.

In the capacitor 310, the insulating layer 205 is formed over an electrode 203, and a semiconductor layer 206 is formed over the insulating layer 205. An electrode 208 is formed in contact with part of the semiconductor layer 206, and the insulating layer 211 is formed over the electrode 208 so as to be in contact with another part of the semiconductor layer 206. The same structure as that of the variable capacitor 100 disclosed in Embodiment 1 is applied to the capacitor 310. Note that in FIGS. 6A and 6B and FIG. 7, the semiconductor layer 206 is formed so as not to extend beyond edges of the electrode 203; however, the semiconductor layer 206 may be formed so as to extend beyond the edges of the electrode 203.

An insulating layer 212 is formed over the insulating layer 211, and the pixel electrode 214 is formed over the insulating layer 212. The pixel electrode 214 is electrically connected to the drain electrode 210 through a contact hole 213 provided in the insulating layer 211 and the insulating layer 212. The drain electrode 210 and the electrode 208 are electrically connected to each other.

The gate electrode 204 of the transistor 220 is electrically connected to a first wiring 224-$i$ and the source electrode 209 thereof is electrically connected to a second wiring 228-$j$. The electrode 203 of the capacitor 310 is electrically connected to a third wiring 223-$i$.

Note that the first wiring 224-$i$, the second wiring 228-$j$, and the third wiring 223-$i$ respectively correspond to the first wiring 1111-$i$, the second wiring 1112-$j$, and the third wiring 1113-$i$ in FIG. 5A.

In the transistor 220 described in this embodiment, the drain electrode 210 is surrounded by the source electrode 209 that is U-shaped (or C-shaped, square-bracket-like shaped, or horseshoe-shaped). With such a shape, an enough channel width can be ensured even when the area occupied by the transistor is small, and accordingly, the amount of current flowing at the time of conduction of the transistor (also referred to as the on-state current) can be increased.

If parasitic capacitance generated between the gate electrode 204 and the drain electrode 210 electrically connected to the pixel electrode 214 is large, the transistor is easily influenced by feedthrough, which may cause degradation in display quality because the potential supplied to the liquid crystal element cannot be held accurately. With the structure in which the source electrode 209 is U-shaped and surrounds the drain electrode 210 as described in this embodiment, an enough channel width can be ensured and parasitic capacitance generated between the drain electrode 210 and the gate electrode 204 can be reduced. Therefore, the display quality of a liquid crystal display device can be improved.

The pixel electrode 214 is formed so as to overlap with part of the first wiring 224-$i$, part of a first wiring 2244-$i$+1, part of the second wiring 228-$j$, and part of a second wiring 228-$j$+1, so that the first wiring 224-$i$, the first wiring 224-$i$+1, the second wiring 228-$j$, and the second wiring 228-$j$+1 are used as light-blocking layers. Thus, a reduction in contrast due to disclination, light leakage, or the like can be prevented and the display quality of the liquid crystal display device can be improved.

Figure 8A:
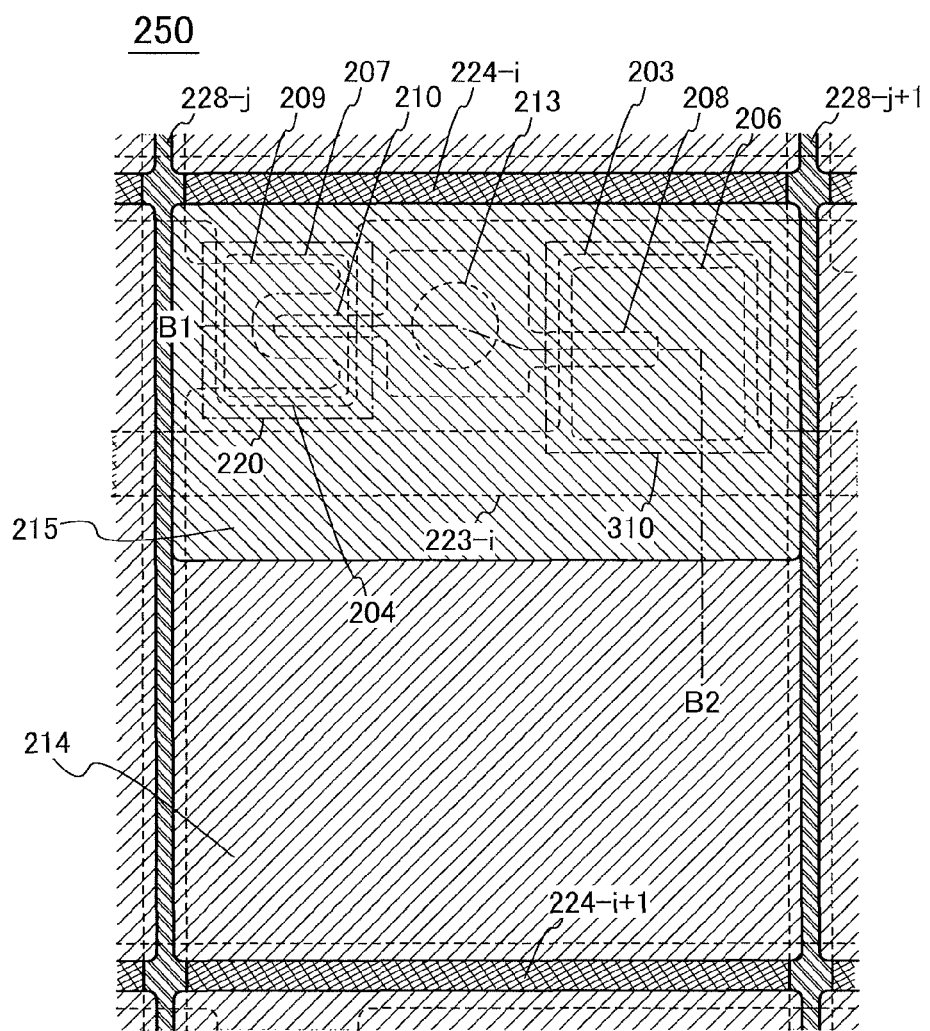
FIGS. 8A and 8B are a top view and a cross-sectional view illustrating one embodiment of the present invention.
Figure 8B:
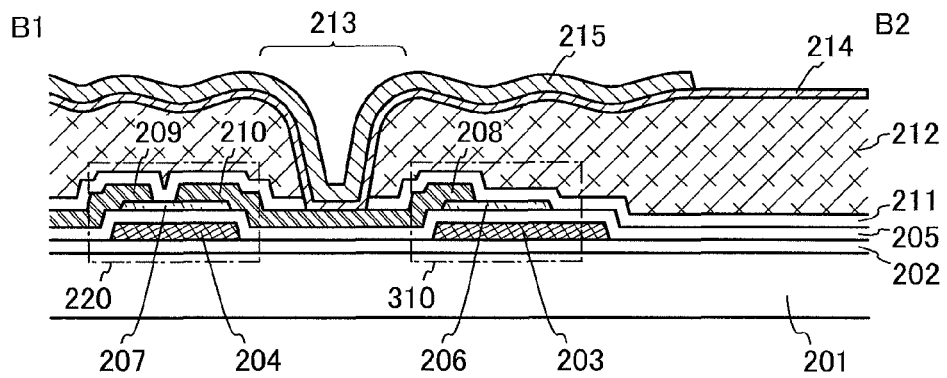

Then, an example of a pixel structure which is different from that illustrated in FIGS. 6A and 6B and FIG. 7 will be described with reference to FIGS. 8A and 8B. FIG. 8A is a top view illustrating a plan structure of a pixel 250. FIG. 8B is a cross-sectional view illustrating a stacked structure of a portion indicated by chain line B1-B2 in FIG. 8A. In the pixel 250 illustrated in FIGS. 8A and 8B, a structure of a pixel electrode is different from that in the pixel 200 illustrated in FIGS. 6A and 6B and FIG. 7. In the pixel 250 in FIGS. 8A and 8B, a pixel electrode 215 which reflects light is provided over the pixel electrode 214 having a light-transmitting property, whereby a semi-transmissive pixel structure is obtained. Part of the pixel functions as a reflective pixel portion, so that a liquid crystal display device which is excellent in visibility even in a relatively bright environment can be realized.

In the pixel 250, a surface of the insulating layer 212 overlapping with the pixel electrode 215 is made uneven, and the unevenness is reflected in the pixel electrode 215. By the uneven surface of the pixel electrode 215, incident light from the outside is reflected diffusely, whereby more favorable display can be performed. Accordingly, visibility of reflective display is improved.

Then, a manufacturing method of the pixel portion of the liquid crystal display device described with reference to FIGS. 6A and 6B and FIG. 7 will be described with reference to FIGS. 9A to 9D and FIGS. 10A and 10B. Cross sections A1-A2 in FIGS. 9A to 9D and FIGS. 10A and 10B are cross sections of a portion indicated by chain line A1-A2 in FIGS. 6A and 6B and FIG. 7.

First, the insulating layer 202 to be a base layer is formed with a thickness of greater than or equal to 50 nm and less than or equal to 300 nm, preferably greater than or equal to 100 nm and less than or equal to 200 nm over the substrate 201. As the substrate 201, a glass substrate, a ceramic substrate, a plastic substrate that has high heat resistance enough to withstand a process temperature of this manufacturing process, or the like can be used. In the case where a substrate does not need a light-transmitting property, a metal substrate such as a stainless alloy substrate, whose surface is provided with an insulating layer, may be used. As the glass substrate, for example, an alkali-free glass substrate of barium borosilicate glass, aluminoborosilicate glass, aluminosilicate glass, or the like may be used. Alternatively, a quartz substrate, a sapphire substrate, or the like can be used. By containing more barium oxide (BaO) than boron oxide ($B_2O_3$), a more practical heat-resistant glass substrate can be obtained. Therefore, a glass substrate containing BaO and $B_2O_3$ so that the amount of BaO is larger than that of $B_2O_3$ is preferably used.

Further, as the substrate 201, a glass substrate with any of the following sizes can be used: the 3rd generation (550 mm×650 mm), the 3.5th generation (600 mm×720 mm or 620 mm×750 mm), the 4th generation (680×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

The insulating layer 202 can be formed with a single-layer structure or a layered structure including at least one of the following insulating layers: an aluminum nitride layer, an aluminum oxynitride layer, a silicon nitride layer, a silicon oxide layer, a silicon nitride oxide layer, and a silicon oxynitride layer. The insulating layer 202 has a function of preventing diffusion of an impurity element from the substrate 201. Note that in this specification, silicon nitride oxide refers to silicon that includes more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. The insulating layer 202 can be formed by a sputtering method, a CVD method, a coating method, a printing method, or the like as appropriate.

In this embodiment, a stack of layers of silicon nitride and silicon oxide is used as the insulating layer 202. Specifically, a layer of silicon nitride is formed with a thickness of 50 nm over the substrate 201, and a layer of silicon oxide is formed with a thickness of 150 nm over the layer of silicon nitride. Note that the insulating layer 202 may contain phosphorus (P) or boron (B).

When a halogen element such as chlorine or fluorine is contained in the insulating layer 202, a function of preventing diffusion of an impurity element from the substrate 201 can be further improved. The peak of the concentration of a halogen element contained in the insulating layer 202, measured by secondary ion mass spectrometry (SIMS), may be higher than or equal to $1×10^{15}/cm^3$ and lower than or equal to $1×10^{20}/cm^3$.

The insulating layer 202 may be formed using gallium oxide. Alternatively, the insulating layer 202 may have a layered structure of a gallium oxide layer and the above insulating layer. Gallium oxide is a material which is hardly charged; therefore, variation in threshold voltage due to charge buildup of the insulating layer can be suppressed.

Next, over the insulating layer 202, a conductive layer is formed with a thickness of greater than or equal to 100 nm and less than or equal to 500 nm, preferably greater than or equal to 200 nm and less than or equal to 300 nm, by a sputtering method, a vacuum evaporation method, or a plating method. Then, a resist mask is formed by a first photolithography step, and the conductive layer is selectively etched, whereby the gate electrode 204 and the electrode 203 are formed (see FIG. 9A). Although not illustrated, wiring layers such as the first wiring 224-$i$ and the third wiring 223-$i$ are formed at the same time.

The conductive layer for forming the gate electrode 204, the electrode 203, and the like can be formed with a single-layer structure or a layered structure using a metal material such as molybdenum (Mo), titanium (Ti), tungsten (W), tantalum (Ta), aluminum (Al), copper (Cu), chromium (Cr), neodymium (Nd), scandium (Sc), or magnesium (Mg), or an alloy material containing any of these elements as its main component.

Since the conductive layer is formed to serve also as a wiring, it is preferable to use Al or Cu which is a low-resistance material. When Al or Cu is used, signal delay is reduced, so that higher image quality can be realized. Al has low heat resistance; therefore, defects due to a hillock, a whisker, or migration tend to be caused. In order to prevent migration of Al, a layered structure including Al and a metal material having a higher melting point than Al such as Mo, Ti, or W is preferably used. In the case where a material containing Al is used for the conductive layer, the maximum process temperature in later steps is preferably set to 380° C. or lower, further preferably 350° C. or lower.

Also when Cu is used for the conductive layer, in order to prevent a defect due to migration and diffusion of Cu elements, a layered structure including Cu and a metal material having a higher melting point than Cu, such as Mo, Ti, or W, is preferably used. Further, in the case where a material containing Cu is used for the conductive layer, the maximum process temperature in later steps is preferably set to 450° C. or lower.

In this embodiment, the conductive layer is formed as follows: a Ti layer with a thickness of 5 nm is formed over the insulating layer 202, and a Cu layer with a thickness of 250 nm is formed over the Ti layer. Then, the conductive layer is selectively removed by etching through the first photolithography step, whereby the gate electrode 204 and the electrode 203 are formed (see FIG. 9A). The formed gate electrode 204 and electrode 203 preferably have tapered edges because coverage with an insulating layer or a conductive layer that is later to be stacked thereover can be improved.

Note that a resist mask used in the photolithography step may be formed by an inkjet method. An inkjet method needs no photomask; thus, manufacturing cost can be further reduced. The resist mask is to be removed after the etching step, and the description about the removal of the resist mask in each photolithography step is omitted in this embodiment.

Note that unless otherwise specified, a photolithography step in this specification includes a step of forming a resist mask, a step of etching a conductive layer or an insulating layer, and a step of removing the resist mask.

Then, the insulating layer 205 is formed with a thickness of greater than or equal to 50 nm and less than or equal to 800 nm, preferably greater than or equal to 100 nm and less than or equal to 600 nm over the gate electrode 204 and the electrode 203. Here, the insulating layer 205 also functions as a gate insulating layer. The insulating layer 205 can be formed using silicon oxide, silicon nitride, silicon oxynitride, silicon nitride oxide, aluminum oxide, aluminum nitride, aluminum oxynitride, aluminum nitride oxide, tantalum oxide, gallium oxide, yttrium oxide, lanthanum oxide, hafnium oxide, hafnium silicate ($HfSi_xO_y$ (x>0, y>0)), hafnium silicate to which nitrogen is added, hafnium aluminate to which nitrogen is added, or the like. A plasma CVD method, a sputtering method, or the like can be employed. The insulating layer 205 is not limited to a single layer, and a stack of different layers may be used. For example, the insulating layer 205 may be formed in the following manner: a silicon nitride layer ($SiN_y$ (y>0)) is formed by a plasma CVD method as an insulating layer A and a silicon oxide layer ($SiO_x$ (x>0)) is stacked over the insulating layer A as an insulating layer B.

Other than a sputtering method and a plasma CVD method, the insulating layer 205 can be formed by a film formation method such as a high-density plasma CVD method using microwaves (e.g., a frequency of 2.45 GHz).

In this embodiment, a stack of layers of silicon nitride and silicon oxide is used as the insulating layer 205. Specifically, a layer of silicon nitride is formed with a thickness of 50 nm over the gate electrode 204, and a layer of silicon oxide is formed with a thickness of 100 nm over the layer of silicon nitride.

The insulating layer 205 also functions as a protective layer. With a structure in which the gate electrode 204 containing Cu is covered with the insulating layer containing silicon nitride, diffusion of Cu from the gate electrode 204 can be prevented.

The insulating layer 205 may be formed using a material containing the same kind of component as the oxide semiconductor formed later. In the case where the insulating layer 205 is a stack of different layers, a layer in contact with the oxide semiconductor is formed using a material containing the same kind of component as the oxide semiconductor. This is because such a material is compatible with the oxide semiconductor, and therefore, the use of such a material for the insulating layer 205 enables a state of the interface between the insulating layer 205 and the oxide semiconductor to be kept well. Here, "the same kind of component as the oxide semiconductor" means one or more of elements selected from constituent elements of the oxide semiconductor. For example, in the case where the oxide semiconductor is formed using an In—Ga—Zn-based oxide semiconductor material, gallium oxide is given as a material containing the same kind of component as the oxide semiconductor.

In the case of employing a layered structure for the insulating layer 205, the insulating layer 205 may have a layered structure of a film formed using a material containing the same kind of component as the oxide semiconductor and a film formed using a material different from that of the film.

In order that hydrogen, a hydroxyl group, and moisture are contained as little as possible in the oxide semiconductor layer, it is preferable that the substrate 201 be preheated in a preheating chamber of a sputtering apparatus as pretreatment before formation of the oxide semiconductor layer, so that impurities such as hydrogen or moisture adsorbed onto the substrate 201 or the insulating layer 205 are eliminated and removed. As an exhaustion unit provided in the preheating chamber, a cryopump is preferable. Note that this preheating treatment can be omitted. Further, this preheating may be similarly performed on the substrate 201 over which layers up to and including the gate electrode 204, the electrode 203, and the like are formed, before the formation of the insulating layer 205.

In this embodiment, the semiconductor layer 206 and the semiconductor layer 207 each include an oxide semiconductor. The oxide semiconductor can be formed by a sputtering method, an evaporation method, a PCVD method, a PLD method, an ALD method, an MBE method, or the like.

The oxide semiconductor is formed preferably by a sputtering method using an oxygen gas as a sputtering gas. At this time, the substrate heating temperature is set to higher than or equal to 100° C. and lower than or equal to 600° C., preferably higher than or equal to 150° C. and lower than or equal to 550° C., further preferably higher than or equal to 200° C. and lower than or equal to 500° C. The thickness of the oxide semiconductor is more than or equal to 1 nm and less than or equal to 40 nm, preferably more than or equal to 3 nm and less than or equal to 20 nm. As the substrate heating temperature at the time of film formation is higher, the impurity concentration in the obtained oxide semiconductor is lower.

In the case of using the oxide semiconductor for a channel formation region of a transistor, as the oxide semiconductor is thinner, a short-channel effect of the transistor is reduced. However, a too small thickness may increase the influence of the interface scattering and reduce the field effect mobility.

As the oxide semiconductor, any of the following metal oxides can be used: a four-component metal oxide such as an In—Sn—Ga—Zn-based oxide; a three-component metal oxide such as an In—Ga—Zn-based oxide, an In—Sn—Zn-based oxide, an In—Al—Zn-based oxide, a Sn—Ga—Zn-based oxide, an Al—Ga—Zn-based oxide, and a Sn—Al—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, and an In—Ga-based oxide; an In-based oxide; a Sn-based oxide; a Zn-based oxide; and the like. Further, silicon oxide may be contained in the above oxide semiconductor.

The oxide semiconductor preferably contains at least indium (In) or zinc (Zn). In particular, In and Zn are preferably contained. In order to obtain an i-type (intrinsic) oxide semiconductor, dehydration or dehydrogenation treatment and supply of oxygen to be performed later are effective.

Note that in the case of using the oxide semiconductor for a channel formation region of a transistor, as a stabilizer for reducing the variation in electric characteristics of the transistor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that, for example, an In—Ga—Zn-based oxide semiconductor means an oxide semiconductor containing indium (In), gallium (Ga), and zinc (Zn) and there is no particular limitation on the ratio of In:Ga:Zn. The In—Ga—Zn-based oxide semiconductor may contain a metal element other than In, Ga, and Zn.

As the oxide semiconductor, a thin film represented by the chemical formula, $InMO_3(ZnO)_m$ (m>0) can be used. Here, M represents one or more metal elements selected from Sn, Zn, Fe, Ga, Al, Mn, and Co. Alternatively, a material represented by $In_2SnO_5(ZnO)_n$ (n>0) may be used as the oxide semiconductor.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor layer in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, further preferably less than or equal to 0.1 nm.

In this embodiment, an oxide semiconductor with a thickness of 30 nm is formed as an oxide semiconductor layer by a sputtering method with the use of an In—Ga—Zn-based oxide target. The oxide semiconductor layer can be formed by a sputtering method under a rare gas (typically, argon) atmosphere, an oxygen atmosphere, or a mixed atmosphere of a rare gas and oxygen. In the case where a mixed gas of a rare gas and oxygen is used as a sputtering gas, the percentage of the oxygen gas is 30 vol. % or more, preferably 50 vol. % or more, further preferably 80 vol. % or more.

As a target for forming the oxide semiconductor layer using an In—Ga—Zn-based oxide material by a sputtering method, for example, a metal oxide target having a composition ratio of $In_2O_3:Ga_2O_3:ZnO=1:1:1$ [molar ratio] is used to form an In—Ga—Zn—O layer. Without limitation to the material and the component of the target, for example, a metal oxide target having a composition ratio of $In_2O_3:Ga_2O_3:ZnO=1:1:2$ [molar ratio] may be used. Alternatively, an In—Ga—Zn-based metal oxide target having an atomic ratio of In:Ga:Zn=1:1:1, 4:2:3, 3:1:2, 1:1:2, 2:1:3, or 3:1:4 may be used.

In the case of forming the oxide semiconductor layer using an In—Sn—Zn-based oxide material by a sputtering method, it is preferable to use an In—Sn—Zn-based metal oxide target having an atomic ratio of In:Sn:Zn=1:1:1, 2:1:3, 1:2:2, or 20:45:35.

The relative density of the metal oxide target is higher than or equal to 90% and lower than or equal to 100%, preferably higher than or equal to 95% and lower than or equal to 99.9%. With the use of a metal oxide target with a high relative density, the formed oxide semiconductor layer can be dense.

It is preferable that a high-purity gas from which impurities such as hydrogen, water, a hydroxyl group, or hydride are removed be used as a sputtering gas for the formation of the oxide semiconductor layer. For example, when argon is used as a sputtering gas, it is preferable that the purity be 9N, the dew point be −121° C., the content of $H_2O$ be 0.1 ppb or lower, and the content of $H_2$ be 0.5 ppb or lower. When oxygen is used as a sputtering gas, it is preferable that the purity be 8N, the dew point be −112° C., the content of $H_2O$ be 1 ppb or lower, and the content of $H_2$ be 1 ppb or lower.

When the oxide semiconductor layer is formed, the substrate is held in a deposition chamber kept under a reduced pressure, and the substrate temperature is set to a temperature of higher than or equal to 100° C. and lower than or equal to 600° C., preferably higher than or equal to 300° C. and lower than or equal to 500° C. In the case where Al is used for the electrodes and wirings formed through the first photolithography step, the substrate temperature is set to be 380° C. or lower, preferably 350° C. or lower. In the case where Cu is used for the electrodes and wirings formed through the first photolithography step, the substrate temperature is set to be 450° C. or lower.

By heating the substrate during film formation, the concentration of impurities such as hydrogen, moisture, a hydride, or a hydroxyl group in the oxide semiconductor layer can be reduced. In addition, damage by sputtering can be reduced. Then, a sputtering gas from which hydrogen and moisture are removed is introduced into the deposition chamber while moisture remaining therein is removed, and the oxide semiconductor layer is formed with the use of the above target.

In order to remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. In the deposition chamber which is evacuated with the cryopump, a hydrogen atom, a compound containing a hydrogen atom, such as water ($H_2O$), (more preferably, also a compound containing a carbon atom), and the like are evacuated, whereby the impurity concentration in the oxide semiconductor layer formed in the deposition chamber can be reduced.

An example of the film formation condition is as follows: the distance between the substrate and the target is 100 mm, the pressure is 0.6 Pa, the electric power of the DC power source is 0.5 kW, and oxygen (the flow rate of oxygen is 100%) is used as a sputtering gas. Note that a pulsed direct-current power source is preferably used, in which case powder substances (also referred to as particles or dust) that are generated in film formation can be reduced and the film thickness can be uniform.

The concentrations of alkali metals such as sodium (Na), lithium (Li), and potassium (K) in the oxide semiconductor layer are preferably as follows: the Na concentration is $5 \times 10^{16}$ cm$^{-3}$ or lower, preferably $1 \times 10^{16}$ cm$^{-3}$ or lower, further preferably $1 \times 10^{15}$ cm$^{-3}$ or lower; the Li concentration is $5 \times 10^{15}$ cm$^{-3}$ or lower, preferably $1 \times 10^{15}$ cm$^{-3}$ or lower; and the K concentration is $5 \times 10^{15}$ cm$^{-3}$ or lower, preferably $1 \times 10^{15}$ cm$^{-3}$ or lower.

Note that it has been pointed out that an oxide semiconductor is insensitive to impurities, that there is no problem when a considerable amount of metal impurities is contained in the film, and therefore that soda-lime glass which contains a large amount of alkali metal such as sodium and is inexpensive can also be used (Kamiya, Nomura, and Hosono, "Engineering application of solid state physics: Carrier transport properties and electronic structures of amorphous oxide semiconductors: the present status", *KOTAI BUTSURI (SOLID STATE PHYSICS)*, 2009, Vol. 44, pp. 621-633). However, such consideration is not appropriate.

An alkali metal and an alkaline earth metal are adverse impurities for a transistor including an oxide semiconductor layer and are preferably contained as little as possible. An alkali metal, in particular, Na diffuses into an oxide and becomes Na$^+$ when an insulating layer in contact with the oxide semiconductor layer is an oxide. In addition, Na cuts the bond between a metal and oxygen or enters the bond in the oxide semiconductor layer. As a result, transistor characteristics deteriorate (e.g., the transistor becomes normally-on (the shift of a threshold voltage of the transistor to a negative side) or the mobility is decreased). In addition, this also causes variation in the characteristics. Such a problem is significant especially in the case where the hydrogen concentration in the oxide semiconductor layer is sufficiently low. Therefore, the concentration of an alkali metal is strongly required to be set to the above value in the case where the hydrogen concentration in the oxide semiconductor layer is lower than or equal to $5 \times 10^{19}$ cm$^{-3}$, particularly lower than or equal to $5 \times 10^{18}$ cm$^{-3}$.

Next, first heat treatment is performed. By the first heat treatment, excessive hydrogen (including water and a hydroxyl group) in the oxide semiconductor layer is removed (dehydration or dehydrogenation), the structure of the oxide semiconductor layer is ordered, and the impurity concentration in the oxide semiconductor layer can be reduced.

The first heat treatment is preferably performed at higher than or equal to 250° C. and lower than or equal to 750° C., or higher than or equal to 400° C. and lower than the strain point of the substrate in a reduced pressure atmosphere, an inert gas atmosphere such as a nitrogen atmosphere or a rare gas atmosphere, an oxygen gas atmosphere, or an ultra dry air atmosphere (in air whose moisture content is less than or equal to 20 ppm (the dew point: −55° C.), preferably less than or equal to 1 ppm, further preferably less than or equal to 10 ppb in the case where measurement is performed using a dew-point meter of a cavity ring-down laser spectroscopy (CRDS) system). Note that in the case where Al is used for the electrodes and wirings formed through the first photolithography step, the heat treatment temperature is set to lower than or equal to 380° C., preferably lower than or equal to 350° C. Alternatively, in the case where Cu is used for the electrodes and wirings formed through the first photolithography step, the heat treatment temperature is set to lower than or equal to 450° C. In this embodiment, the substrate is introduced into an electric furnace which is a kind of heat treatment apparatuses, and heat treatment is performed on the oxide semiconductor layer at 450° C. for one hour in a nitrogen atmosphere.

Note that a heat treatment apparatus is not limited to an electric furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the first heat treatment, GRTA may be performed as follows. The substrate is transferred and put in an inert gas heated to a high temperature, is heated for several minutes, and is transferred and taken out of the inert gas heated to the high temperature.

When the heat treatment is performed in an atmosphere of an inert gas such as nitrogen or a rare gas, oxygen, or ultra-dry air, it is preferable that the atmosphere do not contain water, hydrogen, or the like. Further, the purity of nitrogen, oxygen, or a rare gas introduced into a heat treatment apparatus is 6N (99.9999%) or higher, preferably 7N (99.99999%) or higher (that is, the impurity concentration is 1 ppm or lower, preferably 0.1 ppm or lower).

The first heat treatment is preferably performed in such a manner that after heat treatment is performed in a reduced pressure atmosphere or an inert atmosphere, the atmosphere is switched to an oxidation atmosphere with the temperature maintained and heat treatment is further performed. By the heat treatment in a reduced pressure atmosphere or an inert gas atmosphere, the impurity concentration in the oxide semiconductor layer can be reduced; however, at the same time, oxygen deficiency occurs. The oxygen deficiency generated at this time can be reduced by heat treatment in an oxidizing atmosphere.

In the oxide semiconductor layer which is highly purified by sufficiently reducing the concentration of hydrogen and in which defect levels in an energy gap due to oxygen deficiency are reduced by supplying a sufficient amount of oxygen, the carrier density is lower than $1 \times 10^{12}$/cm$^3$, preferably lower than $1 \times 10^{11}$/cm$^3$, further preferably lower than $1.45 \times 10^{10}$/cm$^3$. For example, the off-state current (per unit channel width (1 μm) here) at room temperature (25° C.) is 100 zA/μm (1 zA (zeptoampere) is $1 \times 10^{-21}$ A) or less, preferably 10 zA/μm or less. The off-state current at 85° C. is 100 zA/μm ($1 \times 10^{-19}$ A/μm) or less, preferably 10 zA/μm ($1 \times 10^{-20}$ A/μm) or less. In this manner, by using an i-type (intrinsic) or substantially i-type oxide semiconductor layer, the transistor 220 which has extremely favorable off-state current characteristics can be obtained.

The electric characteristics of a transistor including a highly purified oxide semiconductor layer, such as the threshold voltage and on-state current of the transistor, have almost no temperature dependence. Further, transistor characteristics hardly change due to light deterioration.

As described above, variation in electric characteristics of a transistor including a highly purified and electrically i-type (intrinsic) oxide semiconductor layer obtained by reducing the oxygen deficiency is suppressed and thus, the transistor is electrically stable. Consequently, a semiconductor device including an oxide semiconductor layer, which has high reliability and stable electric characteristics, can be provided.

Figure 9A:
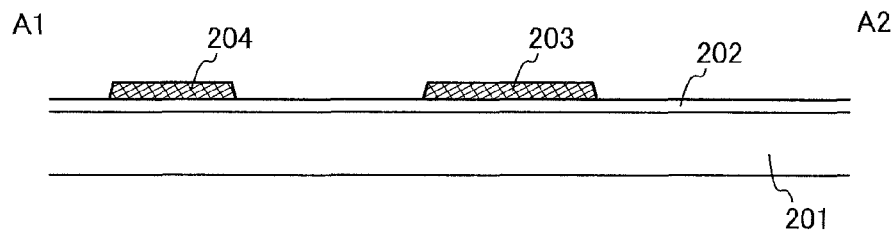
FIGS. 9A to 9D are cross-sectional views illustrating one embodiment of the present invention.
Figure 9B:
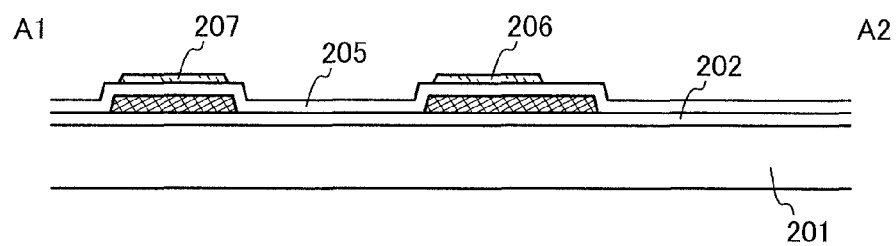
Figure 9C:
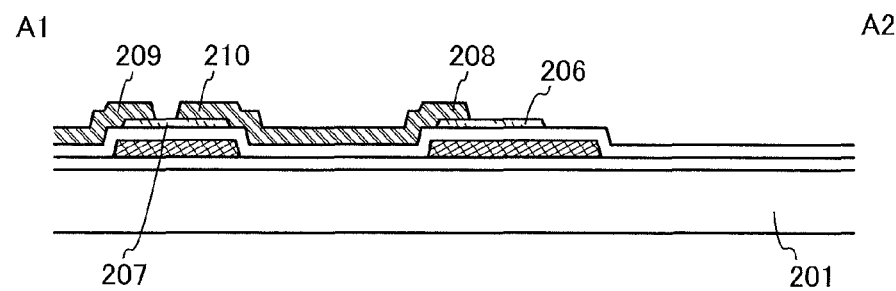

Next, the oxide semiconductor layer is selectively removed by etching through a second photolithography step, so that the semiconductor layer 206 and the semiconductor layer 207 are formed (see FIG. 9B). A resist mask for forming the semiconductor layer 206 and the semiconductor layer 207 may be formed by an inkjet method. Formation of the resist mask by an inkjet method needs no photomask; thus, manufacturing cost can be reduced.

In the case where a contact hole is formed in the insulating layer 205, a step of forming the contact hole can be performed at the same time as processing of the oxide semiconductor layer.

The etching of the oxide semiconductor layer may be dry etching, wet etching, or both dry etching and wet etching. As an etchant used for wet etching of the oxide semiconductor layer, for example, a mixed solution of phosphoric acid, acetic acid, and nitric acid can be used. Alternatively, ITO-07N (produced by KANTO CHEMICAL CO., INC.) may be used.

The first heat treatment may be performed after the second photolithography step is finished.

Then, a conductive layer to be processed into the source electrode 209, the drain electrode 210, and the electrode 208 is formed over the semiconductor layer 206 and the semiconductor layer 207. The conductive layer for forming the source electrode 209, the drain electrode 210, and the electrode 208 can be formed using a material and a method similar to those of the gate electrode 204 and the electrode 203. Further, the conductive layer for forming the source electrode 209, the drain electrode 210, and the electrode 208 may be formed using a conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials in which silicon oxide is contained can be used.

In this embodiment, the conductive layer is formed as follows: a Ti layer with a thickness of 5 nm is formed over the semiconductor layer 206 and the semiconductor layer 207, and a Cu layer with a thickness of 250 nm is formed over the Ti layer. Then, a resist mask is formed by a third photolithography step and the conductive layer is selectively etched; thus, the source electrode 209, the drain electrode 210, and the electrode 208 are formed (see FIG. 9C). Although not illustrated, wiring layers such as the second wiring 228-j are formed at the same time.

Figure 9D:
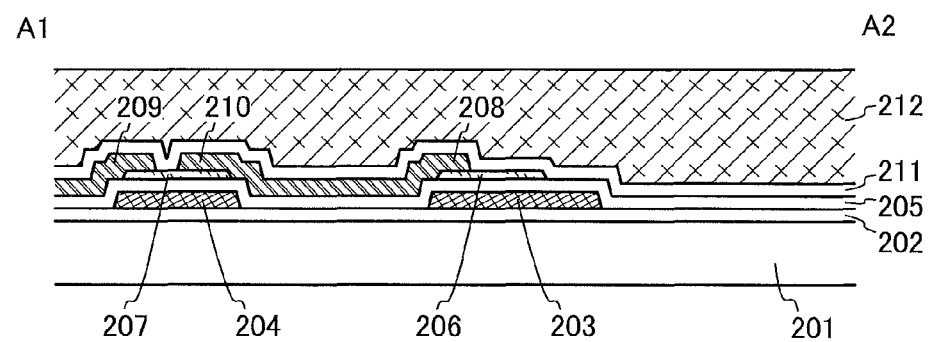

Then, the insulating layer 211 is formed over the source electrode 209, the drain electrode 210, and the electrode 208 (see FIG. 9D). The insulating layer 211 can be formed using a material and a method similar to those of the insulating layer 202 or the insulating layer 205. Sputtering is preferably employed in terms of low possibility of entry of hydrogen, water, and the like. If hydrogen is contained in the insulating layer 211, hydrogen might enter the oxide semiconductor layer or extract oxygen in the oxide semiconductor layer, which might cause a reduction in resistance of the oxide semiconductor layer (which means that the oxide semiconductor layer becomes n-type). Therefore, in the case where the oxide semiconductor layer is made i-type or substantially i-type, it is important to form the insulating layer 211 by a method through which hydrogen and an impurity containing hydrogen are not contained in the insulating layer 211.

In this embodiment, a 200-nm-thick silicon oxide layer is formed as the insulating layer 211 by a sputtering method. The substrate temperature in film formation may be higher than or equal to room temperature and lower than or equal to 300° C. and in this embodiment, is 100° C. The silicon oxide layer can be formed by a sputtering method in a rare gas (typically, argon) atmosphere, an oxygen atmosphere, or a mixed atmosphere containing a rare gas and oxygen. As a target, silicon oxide or silicon can be used. For example, a silicon oxide layer can be formed by sputtering under an atmosphere containing oxygen with the use of silicon for the target.

In order to remove remaining moisture from the deposition chamber at the time of formation of the insulating layer 211, an entrapment vacuum pump (such as a cryopump) is preferably used. When the insulating layer 211 is formed in the deposition chamber evacuated using a cryopump, the impurity concentration in the insulating layer 211 can be reduced. In addition, as an evacuation unit for removing moisture remaining in the deposition chamber of the insulating layer 211, a turbo molecular pump provided with a cold trap may be used.

It is preferable that a high-purity gas from which impurities such as hydrogen, water, a hydroxyl group, or a hydride are removed be used as a sputtering gas used for forming the insulating layer 211.

Then, second heat treatment may be performed in a reduced pressure atmosphere, an inert gas atmosphere, an oxygen gas atmosphere, or an ultra-dry air atmosphere (preferably at higher than or equal to 200° C. and lower than or equal to 600° C., for example, higher than or equal to 250° C. and lower than or equal to 550° C.). Note that in the case where Al is used for the electrodes and wirings formed through the first photolithography step or the third photolithography step, the heat treatment temperature is set to be 380° C. or lower, preferably 350° C. or lower. In the case where Cu is used for the electrodes and wirings formed through the first photolithography step or the third photolithography step, the heat treatment temperature is set to be 450° C. or lower. For example, the second heat treatment may be performed at 450° C. for one hour in a nitrogen atmosphere. In the second heat treatment, part of the oxide semiconductor layer is heated in the state of being in contact with the insulating layer 211, and thus oxygen can be supplied from the insulating layer 211 containing oxygen to the semiconductor layer. It is preferable that the above atmosphere do not contain water, hydrogen, or the like. Alternatively, the supply of oxygen to the semiconductor layer may be performed using an ion implantation method, an ion doping method, or the like.

Then, the insulating layer 212 is formed as a planarization insulating layer over the insulating layer 211 in order to reduce surface unevenness of the transistor 220 and the capacitor 310. The insulating layer 212 can be formed using an organic material having heat resistance, such as polyimide, an acrylic resin, a benzocyclobutene-based resin, polyamide, or an epoxy resin. Other than such organic materials, it is also possible to use a low-dielectric constant material (a low-k material), a siloxane-based resin, PSG (phosphosilicate glass), BPSG (borophosphosilicate glass), or the like. Note that the insulating layer 212 may be formed by stacking a plurality of insulating layers formed using any of these materials (see FIG. 9D).

Figure 10A:
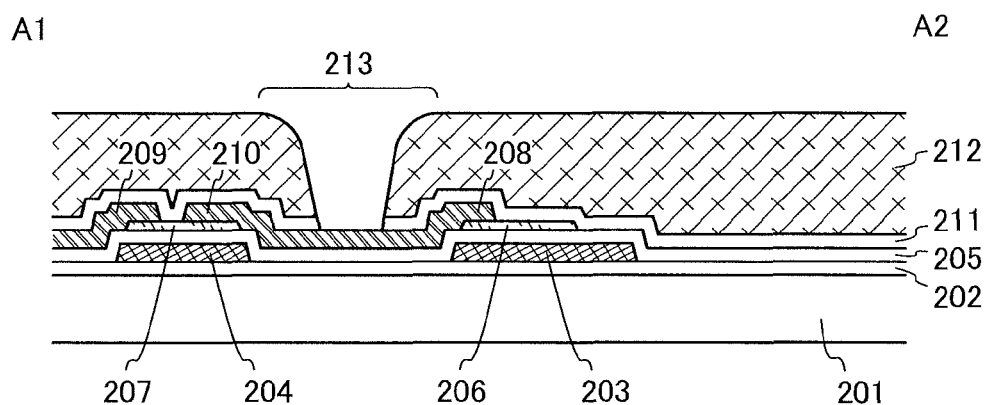
FIGS. 10A and 10B are cross-sectional views illustrating one embodiment of the present invention.

Next, a resist mask is formed by a fourth photolithography step, and over the drain electrode 210, part of the insulating layer 211 and part of the insulating layer 212 are selectively removed, so that the contact hole 213 is formed (see FIG. 10A).

For the etching of the insulating layer 211 and the insulating layer 212, either dry etching or wet etching or both of them may be used. For example, a gas containing chlorine (a chlorine-based gas such as chlorine ($Cl_2$), boron trichloride ($BCl_3$), silicon tetrachloride ($SiCl_4$), or carbon tetrachloride (CCl₄)) can be employed as an etching gas used for the dry etching. As the dry etching, a parallel-plate reactive ion etching (RIE) method, an inductively coupled plasma (ICP) etching method, or the like can be used.

Figure 10B:
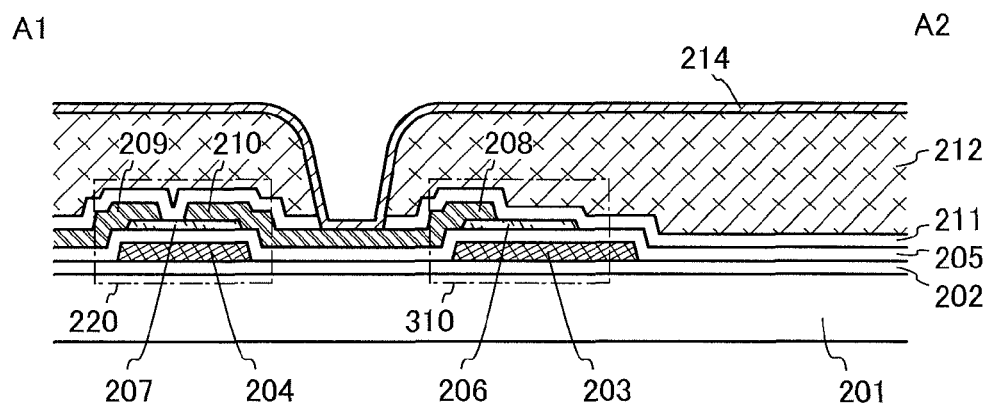

Next, a light-transmitting conductive layer (also referred to as a transparent conductive layer) that is to be processed into the pixel electrode 214 is formed with a thickness of more than or equal to 30 nm and less than or equal to 200 nm, preferably more than or equal to 50 nm and less than or equal to 100 nm, over the insulating layer 212 by a sputtering method, a vacuum evaporation method, or the like (see FIG. 10B).

For the light-transmitting conductive layer, a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added can be used. Alternatively, a material including 1 to 10 graphene sheets (one layer of graphite) may be used.

In this embodiment, a 80-nm-thick ITO layer is formed as the light-transmitting conductive layer, and a resist mask is formed by a fifth photolithography step, and then the light-transmitting conductive layer is selectively etched, whereby the pixel electrode 214 is formed. The pixel electrode 214 is electrically connected to the drain electrode 210 through the contact hole 213.

In this manner, the pixel portion of the liquid crystal display device including the transistor 220 and the capacitor 310 can be manufactured. The manufacturing method described in this embodiment can be applied not only to a transmissive liquid crystal display device illustrated in FIGS. 6A and 6B and FIG. 7, but also to a reflective liquid crystal display device, or a semi-transmissive liquid crystal display device illustrated in FIGS. 8A and 8B. In the case of obtaining a pixel portion of a reflective liquid crystal display device, the pixel electrode 215 may be formed over the pixel electrode 214, using a conductive layer with high light reflectance (also referred to as a reflective conductive layer), for example, using a metal having high visible-light reflectance, such as aluminum, titanium, silver, rhodium, or nickel; an alloy containing at least one of the above metals; or stacked layers of the above materials. In the case of obtaining a pixel portion of a semi-transmissive liquid crystal display device, one pixel electrode may be formed using a transparent conductive layer and a reflective conductive layer to be provided with a transmissive portion and a reflective portion.

In this embodiment, an example of a bottom-gate transistor is described, but this embodiment can also be applied to a top gate transistor.

This embodiment can be implemented in appropriate combination with the structures described in the other embodiments.

Embodiment 4

Figure 11A:
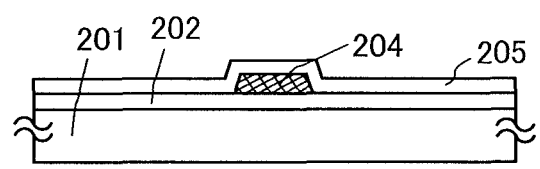
FIGS. 11A to 11C are cross-sectional views illustrating one embodiment of the present invention.
Figure 11B:
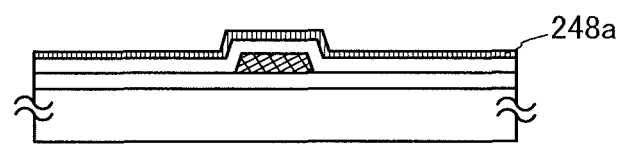
Figure 11C:
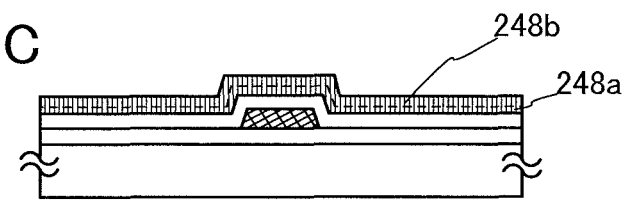

In this embodiment, an example of a process which is partially different from that described in Embodiment 3 will be described with reference to FIGS. 11A to 11C. Note that the same reference numerals are used for the same parts as those in the other embodiments, and detailed description of the parts with the same reference numerals is omitted here.

First, in a manner similar to that of Embodiment 3, the insulating layer 202 serving as a base layer is provided over the substrate 201 having an insulating surface and a conductive layer is formed over the insulating layer 202, and then, the gate electrode 204 is formed through a first photolithography step and an etching step.

In this embodiment, because the film formation temperature of a semiconductor layer to be formed later is higher than or equal to 200° C. and lower than or equal to 450° C. and the temperature of heat treatment after the formation of the semiconductor layer is higher than or equal to 200° C. and lower than or equal to 450° C., the gate electrode 204 is formed of stacked layers of copper for a lower layer and molybdenum for an upper layer or stacked layers of copper for a lower layer and tungsten for an upper layer.

Then, the insulating layer 205 is formed over the gate electrode 204 by a CVD method, a sputtering method, or the like in a manner similar to that of Embodiment 3. The structure obtained through the process up to here is illustrated in the cross-sectional view of FIG. 11A.

Then, over the insulating layer 205, a first oxide semiconductor layer is formed to a thickness of greater than or equal to 1 nm and less than or equal to 10 nm. In this embodiment, the first oxide semiconductor layer is formed to a thickness of 5 nm in an oxygen atmosphere, an argon atmosphere, or a mixed atmosphere of argon and oxygen under such conditions that a target for an oxide semiconductor (a target for an In—Ga—Zn-based oxide semiconductor containing In₂O₃, Ga₂O₃, and ZnO at 1:1:2 [molar ratio]) is used, the distance between the substrate and the target is 170 mm, the substrate temperature is 250° C., the pressure is 0.4 Pa, and the direct current (DC) power is 0.5 kW.

Next, first heat treatment is performed by setting an atmosphere where the substrate is placed to a nitrogen atmosphere or dry air. The temperature of the first heat treatment is higher than or equal to 200° C. and lower than or equal to 450° C. In addition, heating time of the first heat treatment is longer than or equal to 1 hour and shorter than or equal to 24 hours. By the first heat treatment, a first crystalline oxide semiconductor layer 248*a* is formed (see FIG. 11B).

Next, a second oxide semiconductor layer with a thickness of more than 10 nm is Mimed over the first crystalline oxide semiconductor layer 248*a*. In this embodiment, the second oxide semiconductor layer is formed to a thickness of 25 nm in an oxygen atmosphere, an argon atmosphere, or a mixed atmosphere of argon and oxygen under such conditions that a target for an oxide semiconductor (a target for an In—Ga—Zn-based oxide semiconductor containing In₂O₃, Ga₂O₃, and ZnO at 1:1:2 [molar ratio]) is used, the distance between the substrate and the target is 170 mm, the substrate temperature is 400° C., the pressure is 0.4 Pa, and the direct current (DC) power is 0.5 kW.

Then, second heat treatment is performed by setting an atmosphere where the substrate is placed to a nitrogen atmosphere or dry air. The temperature of the second heat treatment is higher than or equal to 200° C. and lower than or equal to 450° C. In addition, heating time of the second heat treatment is longer than or equal to 1 hour and shorter than or equal to 24 hours. By the second heat treatment, a second crystalline oxide semiconductor layer 248*b* is formed (see FIG. 11C).

The following process is similar to that of Embodiment 3, that is, the source electrode 209, the drain electrode 210, the insulating layer 211, and the like are formed.

Thus, in accordance with Embodiment 3, the transistor 220 can be obtained. Note that in the case where this embodiment is employed, the semiconductor layer including a channel formation region of such a transistor has a layered structure of the first crystalline oxide semiconductor layer 248*a* and the second crystalline oxide semiconductor layer 248*b*. The first crystalline oxide semiconductor layer 248*a* and the second crystalline oxide semiconductor layer 248b have c-axis alignment. The first crystalline oxide semiconductor layer 248a and the second crystalline oxide semiconductor layer 248b comprise an oxide including a crystal with c-axis alignment (also referred to as C-Axis Aligned Crystal (CAAC)), which has neither a single crystal structure nor an amorphous structure.

In order to obtain an oxide including CAAC, it is important to form hexagonal crystals in an initial stage of deposition of an oxide semiconductor film and to cause crystal growth from the hexagonal crystals as cores. In order to achieve this, it is preferable that a substrate heating temperature be 100° C. to 500° C., more preferably 200° C. to 400° C., still preferably 250° C. to 300° C. In addition to this, the deposited oxide semiconductor film is subjected to heat treatment at a temperature higher than the substrate heating temperature in the film formation. Therefore, micro-defects in the film and defects at the interface of a stacked layer can be compensated.

In the case of the transistor including a stack of a first crystalline oxide semiconductor layer and a second crystalline oxide semiconductor layer, the amount of change in threshold voltage of the transistor between before and after performance of a bias-temperature (BT) stress test can be reduced even when the transistor is irradiated with light; thus, such a transistor has stable electric characteristics.

Here, CAAC will be described in detail. An oxide including CAAC is an oxide including a crystal with c-axis alignment, which has a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 18A to 18E, FIGS. 19A to 19C, and FIGS. 20A to 20C. In FIGS. 18A to 18E, FIGS. 19A to 19C, and FIGS. 20A to 20C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 18A to 18E, O surrounded by a circle represents tetracoordinate O and O surrounded by a double circle represents tricoordinate O.

Figure 18A:
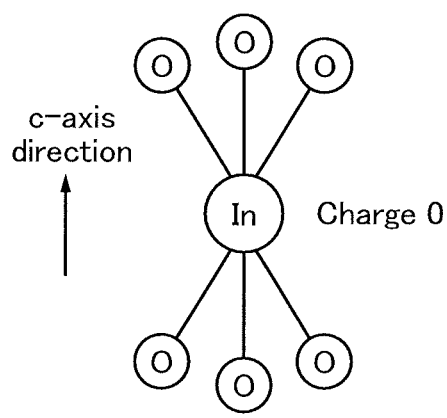
FIGS. 18A to 18E each illustrate a crystal structure of an oxide material.

FIG. 18A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 18A is actually an octahedral structure, but is illustrated as a planar structure for simplicity. Note that three tetracoordinate O atoms exist in each of an upper half and a lower half in FIG. 18A. In the small group illustrated in FIG. 18A, electric charge is 0.

Figure 18D:
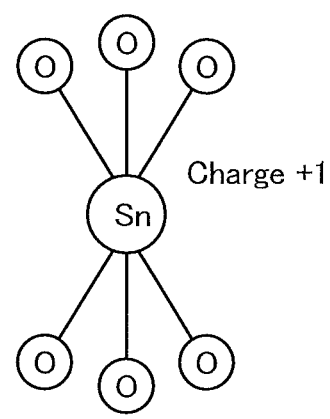
Figure 18B:
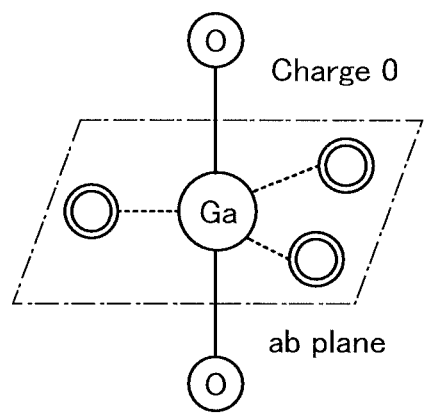

FIG. 18B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 18B. An In atom can also have the structure illustrated in FIG. 18B because an In atom can have five ligands. In the small group illustrated in FIG. 18B, electric charge is 0.

Figure 18E:
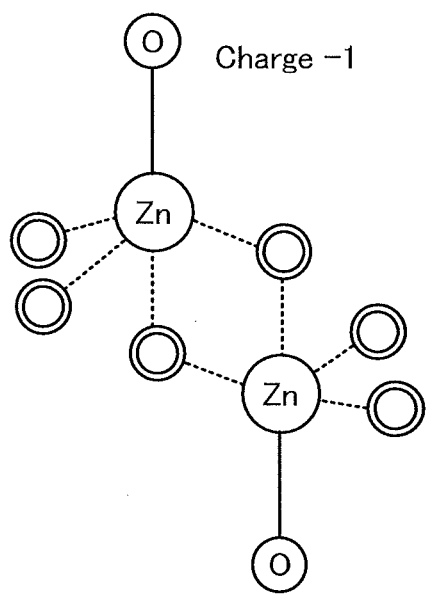
Figure 18C:
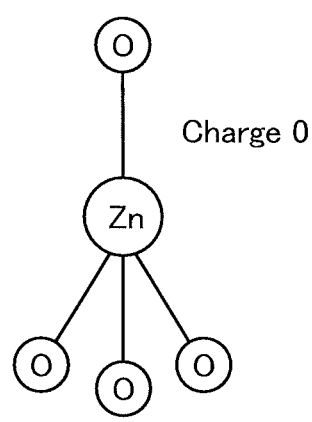

FIG. 18C illustrates a structure including one tetracoordinate Zn atom and four tetracoordinate O atoms proximate to the Zn atom. In FIG. 18C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 18C. In the small group illustrated in FIG. 18C, electric charge is 0.

FIG. 18D illustrates a structure including one hexacoordinate Sn atom and six tetracoordinate O atoms proximate to the Sn atom. In FIG. 18D, three tetracoordinate O atoms exist in each of an upper half and a lower half. In the small group illustrated in FIG. 18D, electric charge is +1.

FIG. 18E illustrates a small group including two Zn atoms. In FIG. 18E, one tetracoordinate O atom exists in each of an upper half and a lower half. In the small group illustrated in FIG. 18E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 18A each have three proximate In atoms in the downward direction, and the three O atoms in the lower half each have three proximate In atoms in the upward direction. The one O atom in the upper half with respect to the pentacoordinate Ga atom in FIG. 18B has one proximate Ga atom in the downward direction, and the one O atom in the lower half has one proximate Ga atom in the upward direction. The one O atom in the upper half with respect to the tetracoordinate Zn atom in FIG. 18C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 19A illustrates a model of a medium group included in a layered structure of an In—Sn—Zn-based oxide. FIG. 19B illustrates a large group including three medium groups. Note that FIG. 19C illustrates an atomic arrangement in the case where the layered structure in FIG. 19B is observed from the c-axis direction.

In FIG. 19A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 19A, one tetracoordinate O atom existing in each of an upper half and a lower half with respect to an In atom is denoted by circled 1. FIG. 19A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 19A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 18E can be given. For example, with one small group including two Zn atoms, electric charge of one small group including a Sn atom can be cancelled, so that the total electric charge of the layered structure can be 0.

When the large group illustrated in FIG. 19B is repeated, a crystal of an In—Sn—Zn-based oxide ($In_2SnZn_3O_8$) can be obtained. Note that a layered structure of the obtained In—Sn—Zn-based oxide can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 20A:
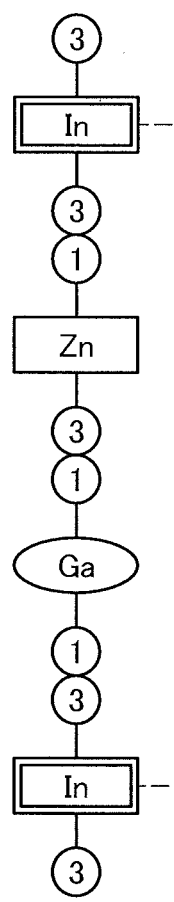
FIGS. 20A to 20C illustrate a crystal structure of an oxide material.

As an example, FIG. 20A illustrates a model of a medium group included in a layered structure of an In—Ga—Zn-based oxide.

In the medium group included in the layered structure of the In—Ga—Zn-based oxide in FIG. 20A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 20B:
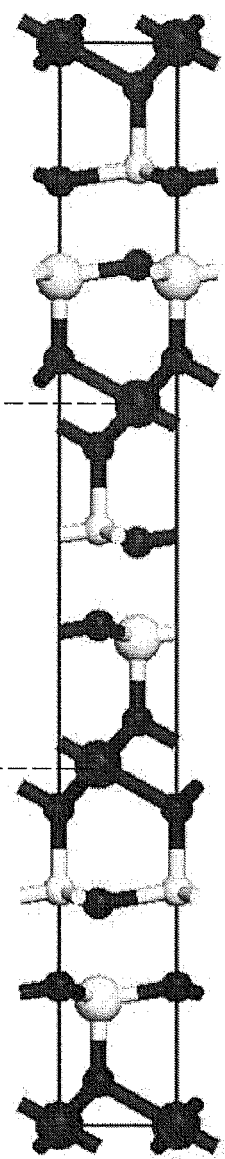
Figure 20C:
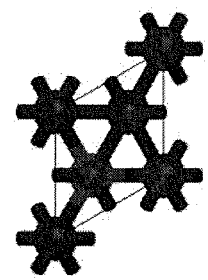

FIG. 20B illustrates a large group including three medium groups. Note that FIG. 20C illustrates an atomic arrangement in the case where the layered structure in FIG. 20B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn-based oxide, a large group can be formed using not only the medium group illustrated in FIG. 20A but also a medium group in which the arrangement of the In atom, the Ga atom, and the Zn atom is different from that in FIG. 20A.

When the large group illustrated in FIG. 20B is repeated, a crystal of an In—Ga—Zn-based oxide can be obtained. Note that a layered structure of the obtained In—Ga—Zn-based oxide can be expressed as a composition formula, $InGaO_3(ZnO)_n$ (n is a natural number).

Figure 21A:
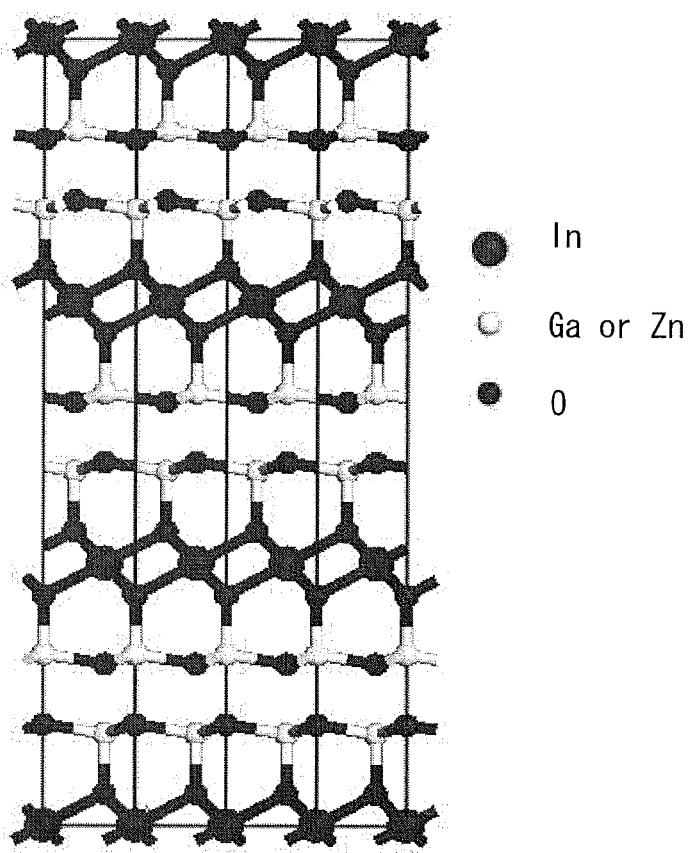
FIGS. 21A and 21B each illustrate a crystal structure of an oxide material.

In the case where n=1 ($InGaZnO_4$), a crystal structure illustrated in FIG. 21A can be obtained, for example. Note that in the crystal structure in FIG. 21A, since a Ga atom and an In atom each have five ligands as described in FIG. 18B, a structure in which Ga is replaced with In can be obtained.

Figure 21B:
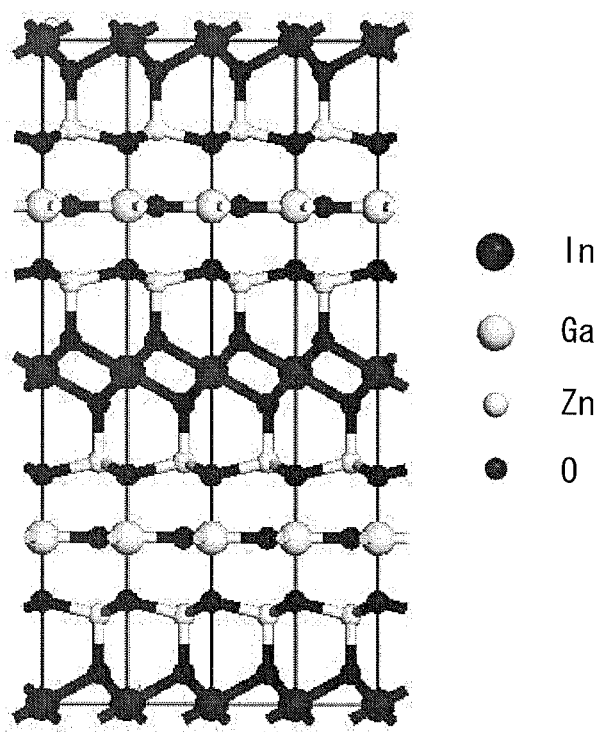

In the case where n=2 ($InGaZn_2O_5$), a crystal structure illustrated in FIG. 21B can be obtained, for example. Note that in the crystal structure in FIG. 21B, since a Ga atom and an In atom each have five ligands as described in FIG. 18B, a structure in which Ga is replaced with In can be obtained.

This embodiment can be implemented in appropriate combination with the structures described in the other embodiments.

Embodiment 5

In this embodiment, structural examples of a transistor will be described. Note that the same portions as those in the above embodiments and portions having functions similar to those in the above embodiments can be formed in a manner similar to that of the above embodiments. The same steps as those in the above embodiments and steps similar to those in the above embodiments can be conducted in a manner similar to those of the above embodiments. Therefore, the descriptions thereof are not repeated in this embodiment. In addition, detailed description of the same portions is not repeated, either.

Figure 12A:
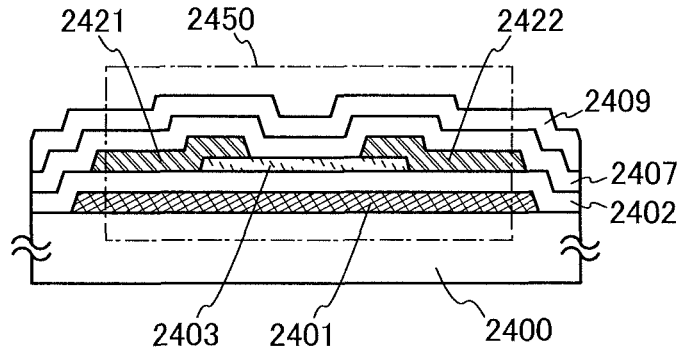
FIGS. 12A to 12D are cross-sectional views each illustrating one embodiment of the present invention.

A transistor 2450 illustrated in FIG. 12A includes a gate electrode 2401 over a substrate 2400, a gate insulating layer 2402 over the gate electrode 2401, an oxide semiconductor layer 2403 over the gate insulating layer 2402, and a source electrode 2421 and a drain electrode 2422 over the oxide semiconductor layer 2403. An insulating layer 2407 is formed over the oxide semiconductor layer 2403, the source electrode 2421, and the drain electrode 2422. A protective insulating layer 2409 may be formed over the insulating layer 2407. The transistor 2450 is a bottom-gate transistor, and is also an inverted staggered transistor.

Figure 12B:
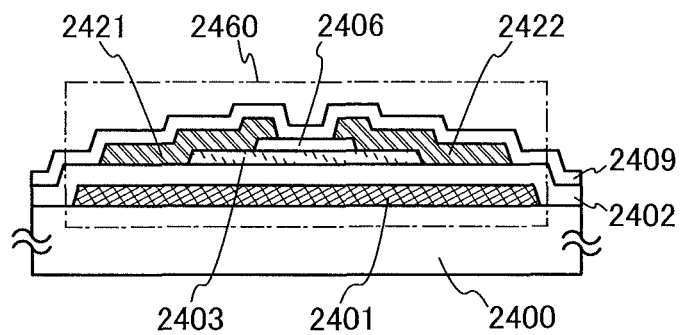

A transistor 2460 illustrated in FIG. 12B includes the gate electrode 2401 over the substrate 2400, the gate insulating layer 2402 over the gate electrode 2401, the oxide semiconductor layer 2403 over the gate insulating layer 2402, a channel protective layer 2406 over the oxide semiconductor layer 2403, and the source electrode 2421 and the drain electrode 2422 over the channel protective layer 2406 and the oxide semiconductor layer 2403. The protective insulating layer 2409 may be formed over the source electrode 2421 and the drain electrode 2422. The transistor 2460 is a bottom-gate transistor called a channel-protective type (also referred to as a channel-stop type) transistor and is also an inverted staggered transistor. The channel protective layer 2406 can be formed using a material and a method similar to those of other insulating layers.

Figure 12C:
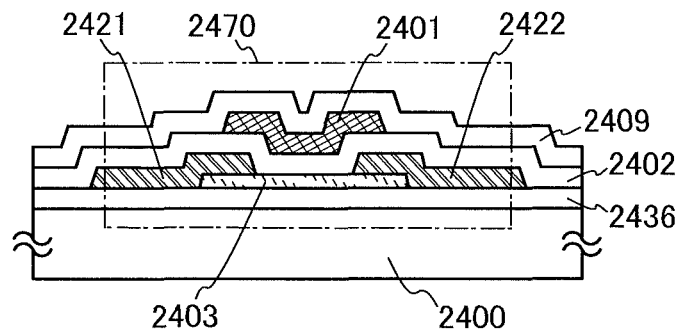

A transistor 2470 illustrated in FIG. 12C includes a base layer 2436 over the substrate 2400; the oxide semiconductor layer 2403 over the base layer 2436; the source electrode 2421 and the drain electrode 2422 over the oxide semiconductor layer 2403 and the base layer 2436; the gate insulating layer 2402 over the oxide semiconductor layer 2403, the source electrode 2421, and the drain electrode 2422; and the gate electrode 2401 over the gate insulating layer 2402. The protective insulating layer 2409 may be formed over the gate electrode 2401. The transistor 2470 is a top-gate transistor.

Figure 12D:
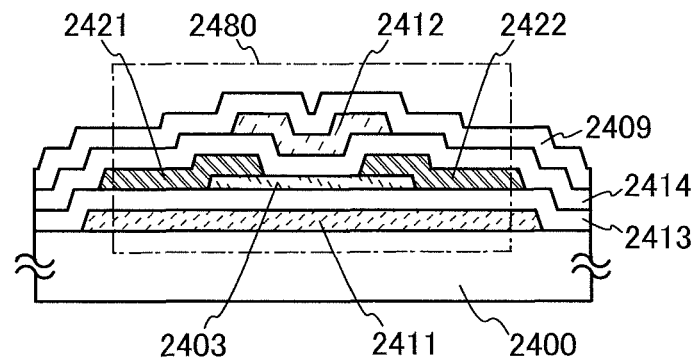

A transistor 2480 illustrated in FIG. 12D includes a first gate electrode 2411 over the substrate 2400, a first gate insulating layer 2413 over the first gate electrode 2411, the oxide semiconductor layer 2403 over the first gate insulating layer 2413, and the source electrode 2421 and the drain electrode 2422 over the oxide semiconductor layer 2403 and the first gate insulating layer 2413. A second gate insulating layer 2414 is formed over the oxide semiconductor layer 2403, the source electrode 2421, and the drain electrode 2422, and a second gate electrode 2412 is formed over the second gate insulating layer 2414. The protective insulating layer 2409 may be formed over the second gate electrode 2412.

The transistor 2480 has a structure combining the transistor 2450 and the transistor 2470. The first gate electrode 2411 and the second gate electrode 2412 can be electrically connected to each other, so that they function as one gate electrode. Either the first gate electrode 2411 or the second gate electrode 2412 may be simply referred to as a gate electrode and the other may be referred to as a back gate electrode.

Figure 13A:
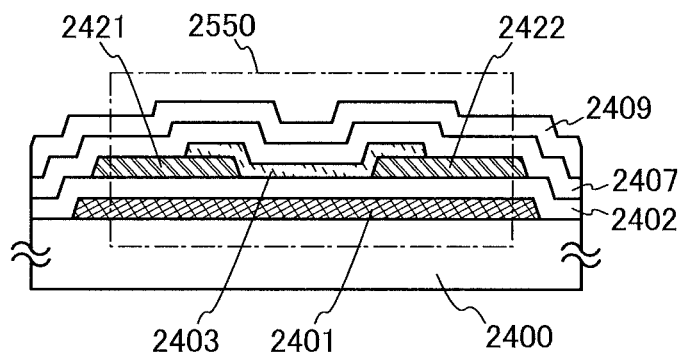
FIGS. 13A to 13C are cross-sectional views each illustrating one embodiment of the present invention.

A transistor 2550 illustrated in FIG. 13A includes the gate electrode 2401 over the substrate 2400, the gate insulating layer 2402 over the gate electrode 2401, the source electrode 2421 and the drain electrode 2422 over the gate insulating layer 2402, and the oxide semiconductor layer 2403 over the gate insulating layer 2402, the source electrode 2421, and the drain electrode 2422. The insulating layer 2407 is formed over the oxide semiconductor layer 2403, the source electrode 2421, and the drain electrode 2422. The protective insulating layer 2409 may be formed over the insulating layer 2407. The transistor 2550 is a bottom-gate transistor and is also an inverted staggered transistor.

Figure 13B:
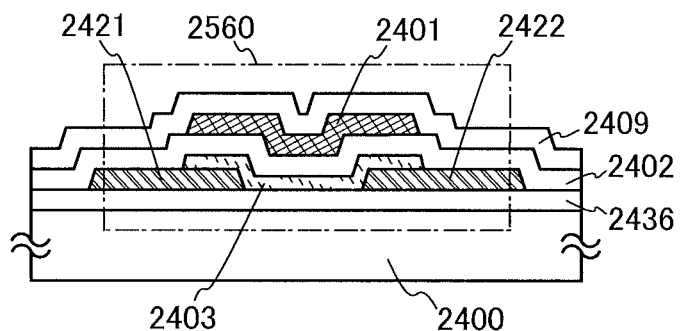

A transistor 2560 illustrated in FIG. 13B includes the base layer 2436 over the substrate 2400, the source electrode 2421 and the drain electrode 2422 over the base layer 2436, the oxide semiconductor layer 2403 over the base layer 2436, the source electrode 2421, and the drain electrode 2422, the gate insulating layer 2402 over the oxide semiconductor layer 2403, the source electrode 2421, and the drain electrode 2422, and the gate electrode 2401 over the gate insulating layer 2402. The protective insulating layer 2409 may be formed over the gate electrode 2401. The transistor 2560 is a top-gate transistor.

Figure 13C:
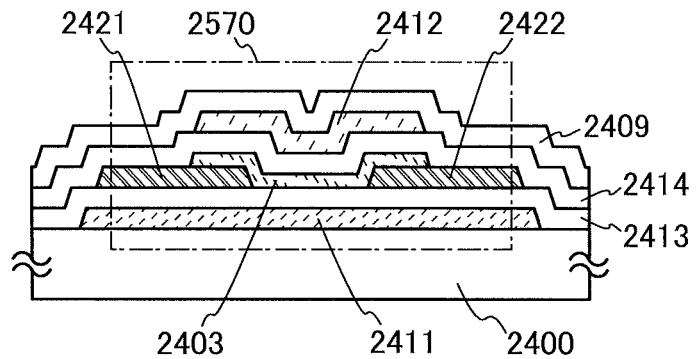

A transistor 2570 illustrated in FIG. 13C includes the first gate electrode 2411 over the substrate 2400, the first gate insulating layer 2413 over the first gate electrode 2411, the source electrode 2421 and the drain electrode 2422 over the first gate insulating layer 2413, the oxide semiconductor layer 2403 over the first gate insulating layer 2413, the source electrode 2421, and the drain electrode 2422, the second gate insulating layer 2414 over the oxide semiconductor layer 2403, the source electrode 2421, and the drain electrode 2422, and the second gate electrode 2412 over the second gate insulating layer 2414. The protective insulating layer 2409 may be formed over the second gate electrode 2412.

The transistor 2570 has a structure combining the transistor 2550 and the transistor 2560. The first gate electrode 2411 and the second gate electrode 2412 can be electrically connected to each other, so that they function as one gate electrode. Either the first gate electrode 2411 or the second gate electrode 2412 may be simply referred to as a gate electrode and the other may be referred to as a back gate electrode.

By changing a potential of the back gate electrode, the threshold voltage of the transistor can be changed. The back gate electrode is formed so as to overlap with a channel formation region in the oxide semiconductor layer 2403. Further, the back gate electrode may be electrically insulated and in a floating state, or may be in a state where the back gate electrode is supplied with a potential. In the latter case, the back gate electrode may be supplied with a potential at the same level as that of the gate electrode, or may be supplied with a fixed potential such as a ground potential. The level of the potential applied to the back gate electrode is controlled, so that the threshold voltage of the transistor 2480 or the transistor 2570 can be controlled.

When the oxide semiconductor layer 2403 is covered with the back gate electrode, light from the back gate electrode side can be prevented from entering the oxide semiconductor layer 2403. Therefore, photodegradation of the oxide semiconductor layer 2403 can be prevented and deterioration in characteristics of the transistor, such as a shift of the threshold voltage, can be prevented.

This embodiment can be implemented in appropriate combination with the structures described in the other embodiments.

Embodiment 6

Figure 14A:
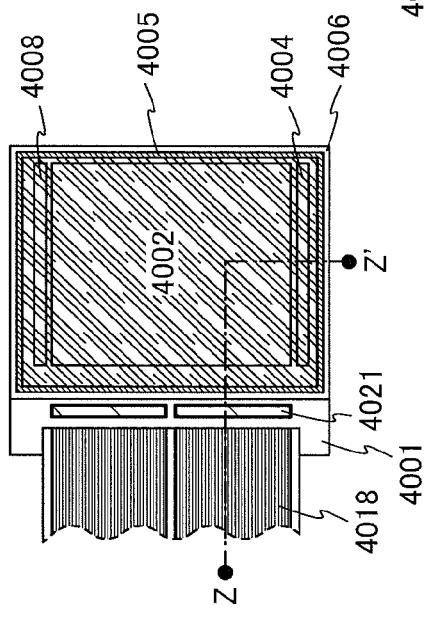
FIGS. 14A and 14B are a top view and a cross-sectional view illustrating one embodiment of the present invention.
Figure 14B:
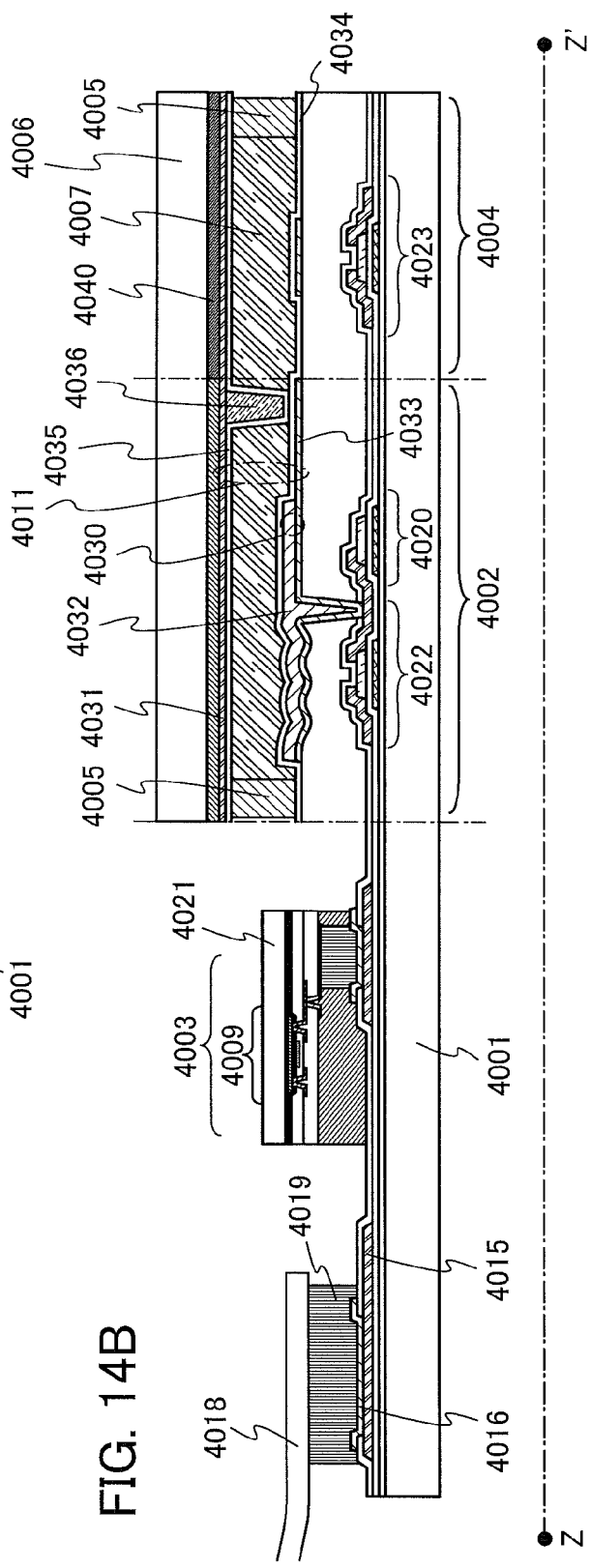

In this embodiment, the appearance of a panel of a liquid crystal display device according to one embodiment of the present invention will be described with reference to FIGS. 14A and 14B. FIG. 14A is a top view of a panel in which a substrate 4001 and a counter substrate 4006 are attached to each other with a sealant 4005, and FIG. 14B is a cross-sectional view taken along dashed line Z-Z' in FIG. 14A.

The sealant 4005 is provided so as to surround a pixel portion 4002, a scan line driver circuit 4004, and a capacitor line driver circuit 4008 provided over the substrate 4001. In addition, the counter substrate 4006 is provided over the pixel portion 4002 and the scan line driver circuit 4004. Thus, the pixel portion 4002 and the scan line driver circuit 4004 are sealed together with a liquid crystal 4007 by the substrate 4001, the sealant 4005, and the counter substrate 4006.

A substrate 4021 provided with a signal line driver circuit 4003 is mounted in a region which is different from a region surrounded by the sealant 4005 over the substrate 4001. FIG. 14B illustrates a transistor 4009 included in the signal line driver circuit 4003.

A plurality of transistors are included in the pixel portion 4002 and the scan line driver circuit 4004 which are provided over the substrate 4001. FIG. 14B illustrates a transistor 4022 and a capacitor 4020 which are included in the pixel portion 4002. The transistor 4022 and the capacitor 4020 each include an oxide semiconductor. A light-blocking layer 4040 which is formed on the counter substrate 4006 overlaps with a transistor 4023 included in the scan line driver circuit 4004. By blocking light to the transistor 4023, deterioration of an oxide semiconductor of the transistor 4023 due to light is prevented; thus, deterioration of characteristics of the transistor 4023, such as a shift of the threshold voltage, can be prevented.

A pixel electrode 4030 included in a liquid crystal element 4011 includes a reflective electrode 4032 and a transparent electrode 4033 and is electrically connected to the transistor 4022 and the capacitor 4020. A counter electrode 4031 of the liquid crystal element 4011 is formed on the counter substrate 4006. A portion where the pixel electrode 4030, the counter electrode 4031, and the liquid crystal 4007 overlap with one another corresponds to the liquid crystal element 4011. The pixel electrode 4030 overlaps with the liquid crystal 4007 with an alignment layer 4034 interposed therebetween, and the counter electrode 4031 overlaps with the liquid crystal 4007 with an alignment layer 4035 interposed therebetween.

Further, a color filter 4041 is formed on the counter substrate 4006 in a region overlapping with the pixel portion 4002.

As examples of a liquid crystal material used for the liquid crystal 4007, the following can be given: a nematic liquid crystal, a cholesteric liquid crystal, a smectic liquid crystal, a discotic liquid crystal, a thermotropic liquid crystal, a lyotropic liquid crystal, a low-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a banana-shaped liquid crystal, and the like.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is only generated within a narrow range of temperature, a chiral agent or an ultraviolet curable resin is added so that the temperature range is improved. The liquid crystal composition which includes a liquid crystal exhibiting a blue phase and a chiral agent has a short response time of 1 msec or less, and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

Moreover, the following methods can be used for driving the liquid crystal, for example: a TN (twisted nematic) mode, an STN (super twisted nematic) mode, a VA (vertical alignment) mode, an MVA (multi-domain vertical alignment) mode, an IPS (in-plane-switching) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a PNLC (polymer network liquid crystal) mode, and a guest-host mode.

A spacer 4036 is a columnar spacer which is formed on the counter substrate 4006 using an insulating layer and is provided in order to control the distance (a cell gap) between the pixel electrode 4030 and the counter electrode 4031. Note that FIG. 14B illustrates the case where the spacer 4036 is formed by patterning the insulating layer; however, a spherical spacer may be used.

A variety of signals and potentials are supplied to the signal line driver circuit 4003, the scan line driver circuit 4004, the capacitor line driver circuit 4008, and the pixel portion 4002 from a connection terminal 4016 through a wiring 4015. The connection terminal 4016 is electrically connected to a terminal of an FPC 4018 through an anisotropic conductive layer 4019.

Note that for the substrate 4001, the counter substrate 4006, and the substrate 4021, glass, ceramics, or plastics can be used. Plastics include, in their category, a fiberglass-reinforced plastic (FRP) plate, a polyvinyl fluoride (PVF) film, a polyester film, an acrylic resin film, and the like. In addition, a sheet having a structure in which an aluminum foil is sandwiched between PVF films can be used.

Note that a substrate placed in a direction in which light is extracted through the liquid crystal element 4011 is formed using a light-transmitting material such as a glass plate, plastic, a polyester film, or an acrylic film.

Figure 15:
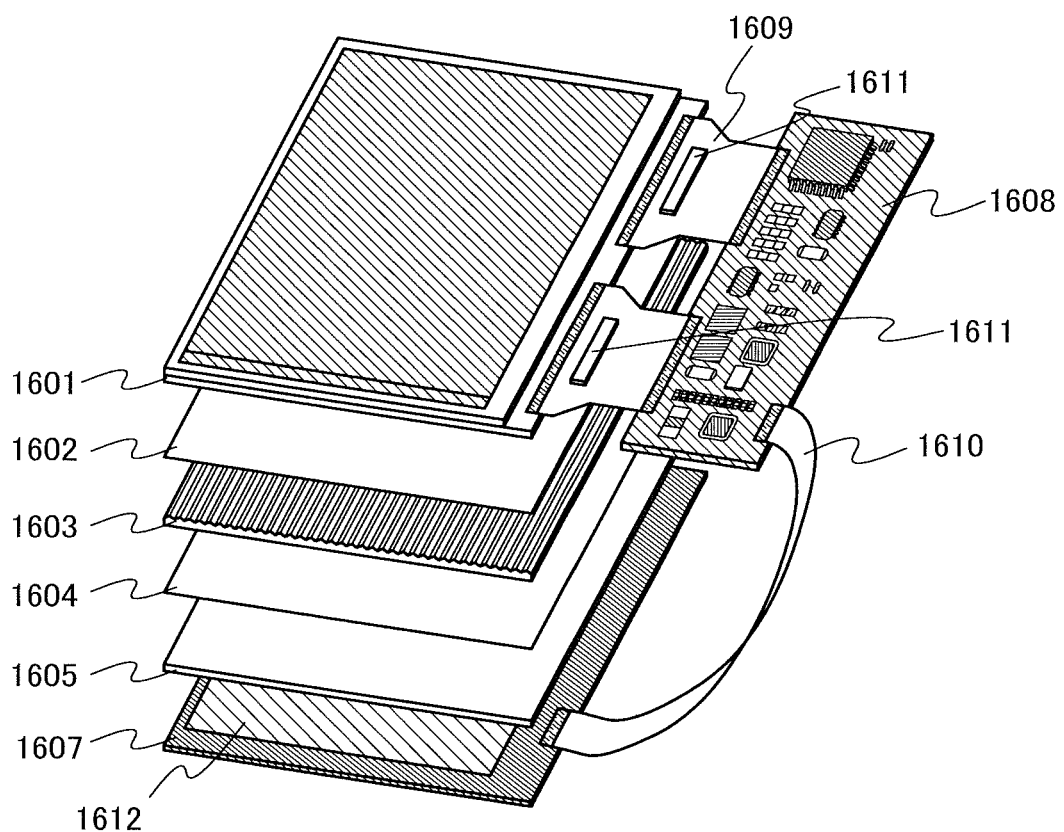
FIG. 15 illustrates one embodiment of the present invention.

FIG. 15 illustrates an example of a perspective view illustrating a structure of the liquid crystal display device according to one embodiment of the present invention. The liquid crystal display device illustrated in FIG. 15 includes a panel 1601 including a pixel portion, a first diffusion plate 1602, a prism sheet 1603, a second diffusion plate 1604, a light guide plate 1605, a backlight panel 1607, a circuit board 1608, and substrates 1611 provided with signal line driver circuits.

The panel 1601, the first diffusion plate 1602, the prism sheet 1603, the second diffusion plate 1604, the light guide plate 1605, and the backlight panel 1607 are sequentially stacked. The backlight panel 1607 has a backlight 1612 including a plurality of light sources. Light from the backlight 1612 that is diffused in the light guide plate 1605 is delivered to the panel 1601 through the first diffusion plate 1602, the prism sheet 1603, and the second diffusion plate 1604.

Although the first diffusion plate 1602 and the second diffusion plate 1604 are used in this embodiment, the number of diffusion plates is not limited to two. The number of diffusion plates may be one, or may be three or more. It is acceptable as long as the diffusion plate is provided between the light guide plate 1605 and the panel 1601. Therefore, the diffusion plate may be provided only on the side closer to the panel 1601 than the prism sheet 1603, or may be provided only on the side closer to the light guide plate 1605 than the prism sheet 1603.

Further, the cross section of the prism sheet 1603 is not limited to a sawtooth shape illustrated in FIG. 15. The prism sheet 1603 can have any shape as long as light from the light guide plate 1605 can be concentrated on the panel 1601 side.

The circuit board 1608 is provided with a circuit which generates various signals input to the panel 1601, a circuit which processes the signals, or the like. In FIG. 15, the circuit board 1608 and the panel 1601 are connected to each other via COF tapes 1609. In addition, the substrates 1611 provided with the signal line driver circuits are connected to the COF tapes 1609 by a chip on film (COF) method.

FIG. 15 illustrates an example in which the circuit board 1608 is provided with a control circuit which controls driving of the backlight 1612 and the control circuit and the backlight panel 1607 are connected to each other through an FPC 1610. Note that the control circuit may be formed over the panel 1601. In that case, the panel 1601 and the backlight panel 1607 are connected to each other through an FPC or the like.

This embodiment can be implemented in appropriate combination with the structures described in the other embodiments.

Embodiment 7

In this embodiment, examples of electronic devices each including the display device described in the above embodiment will be described.

Figure 16A:
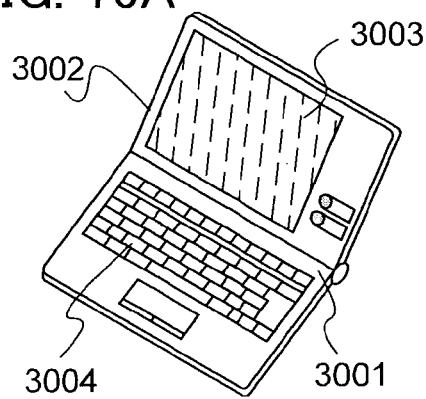
FIGS. 16A to 16F illustrate examples of usage mode of an electronic device.

FIG. 16A illustrates a laptop personal computer including a main body 3001, a housing 3002, a display portion 3003, a keyboard 3004, and the like. By using the liquid crystal display device described in the above embodiment, a highly reliable laptop personal computer can be obtained.

Figure 16B:
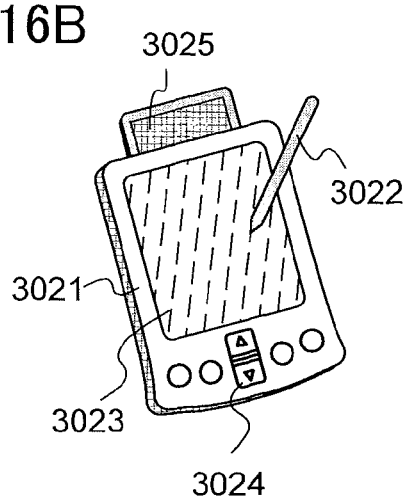

FIG. 16B illustrates a personal digital assistant (PDA) including a display portion 3023, an external interface 3025, an operation button 3024, and the like in a main body 3021. A stylus 3022 is included as an accessory for operation. By using the liquid crystal display device described in the above embodiment, a highly reliable personal digital assistant (PDA) can be obtained.

Figure 16C:
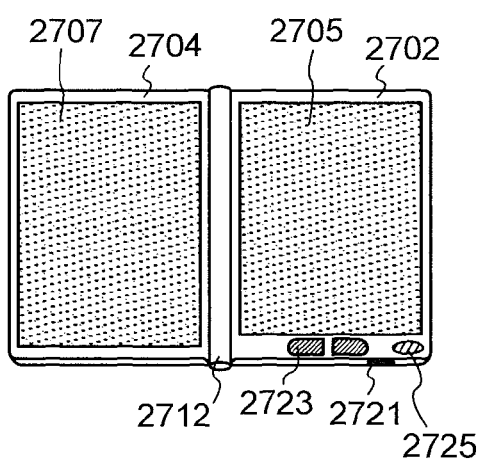

FIG. 16C illustrates an example of an electronic book reader. For example, the electronic book reader includes two housings, a housing 2702 and a housing 2704. The housing 2702 and the housing 2704 are combined with a hinge 2712 so that the electronic book reader can be opened and closed with the hinge 2712 as an axis. With such a structure, the electronic book reader can operate like a paper book.

A display portion 2705 and a display portion 2707 are incorporated in the housing 2702 and the housing 2704, respectively. The display portion 2705 and the display portion 2707 may display one image or different images. In the structure where different images are displayed on the display portion 2705 and the display portion 2707, for example, the right display portion (the display portion 2705 in FIG. 16C) can display text and the left display portion (the display portion 2707 in FIG. 16C) can display images. By using the liquid crystal display device described in the above embodiment, a highly reliable electronic book reader can be obtained.

FIG. 16C illustrates an example in which the housing 2702 is provided with an operation portion and the like. For example, the housing 2702 is provided with a power supply terminal 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the electronic book reader may have a function of an electronic dictionary.

The electronic book reader may transmit and receive data wirelessly. Through wireless communication, desired book data or the like can be purchased and downloaded from an electronic book server.

Figure 16D:
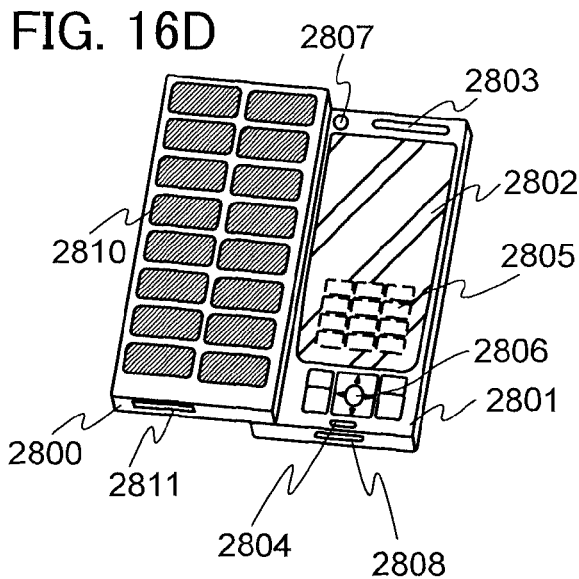

FIG. 16D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the mobile phone, an external memory slot 2811, and the like. Further, an antenna is incorporated in the housing 2801.

Further, the display panel 2802 is provided with a touch panel. A plurality of operation keys 2805 that are displayed as images are shown by dashed lines in FIG. 16D. Note that a boosting circuit by which a voltage output from the solar cell 2810 is increased to be sufficiently high for each circuit is also included.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Further, the housings 2800 and 2801 in a state where they are developed as illustrated in FIG. 16D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided. By using the liquid crystal display device described in the above embodiment, a highly reliable mobile phone can be provided.

Figure 16E:
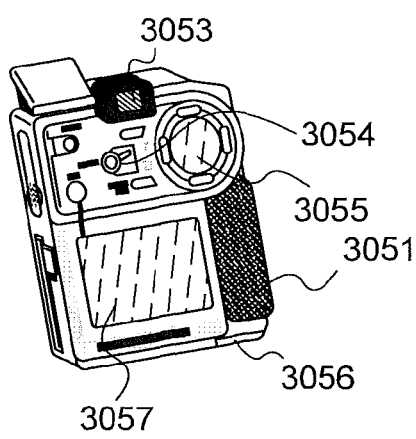

FIG. 16E illustrates a digital video camera including a main body 3051, a display portion A 3057, an eyepiece 3053, an operation switch 3054, a display portion B 3055, a battery 3056, and the like. By using the liquid crystal display device described in the above embodiment, a highly reliable digital video camera can be provided.

Figure 16F:
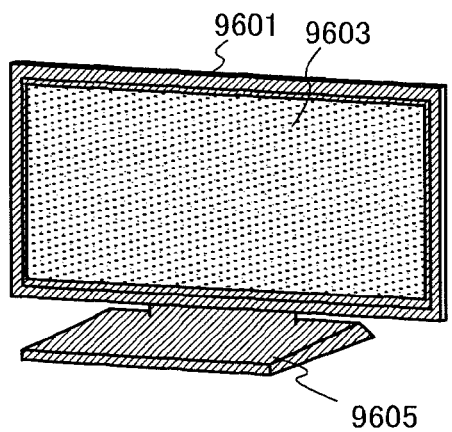

FIG. 16F illustrates an example of a television set. In the television set, a display portion 9603 is incorporated in a housing 9601. The display portion 9603 can display images. Here, the housing 9601 is supported by a stand 9605. By using the liquid crystal display device described in the above embodiment, a highly reliable television set can be provided.

The television set can be operated by an operation switch of the housing 9601 or a separate remote controller. Further, the remote controller may be provided with a display portion for displaying data output from the remote controller.

Note that the television set is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

This embodiment can be implemented in appropriate combination with the structures described in the other embodiments.

Example 1

The operation of a variable capacitor described in the above embodiment was confirmed using a computer.

The calculation was performed with a device simulator "ATLAS" developed by Silvaco Data Systems Inc. A stacked structure of the variable capacitor was similar to that of the variable capacitor 100 in FIGS. 1A to 1C. An i-type In—Ga—Zn-based oxide semiconductor was assumed to be used for the semiconductor layer 103, and its thickness, dielectric constant, electron affinity, and band gap were assumed to be 100 nm, 15, 4.3 eV, and 3.15 eV, respectively. The work function of the first electrode 101 was assumed to be 4.3 eV; the thickness and dielectric constant of the insulating layer 102, 100 nm and 4.1, respectively; the work function of the second electrode 104, 4.3 eV. The ratio between the area C1 where the first electrode 101 and the semiconductor layer 103 overlap with each other and the area C2 where the first electrode 101, the semiconductor layer 103, and the second electrode 104 overlap with one another was C1:C2=3:1. Further, on the assumption that the variable capacitor is used at a fixed voltage (direct-current voltage) or a low-frequency voltage, the frequency was set to 0.01 Hz in the calculation of the capacitance value.

Figure 17A:
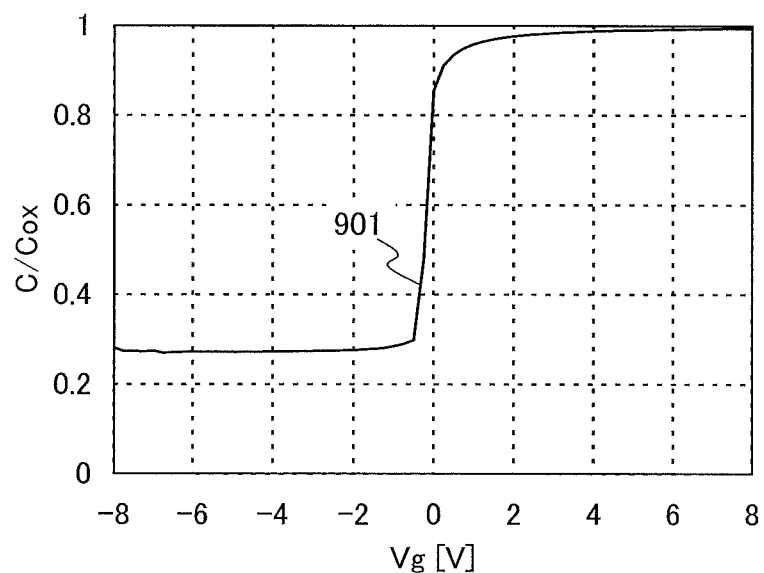
FIGS. 17A and 17B show calculation results regarding a variable capacitor.

FIG. 17A shows calculation results of the variable capacitor 1001n which an In—Ga—Zn-based oxide semiconductor was used for the semiconductor layer 103. In FIG. 17A, the horizontal axis represents the potential of the first electrode 101, and the vertical axis represents the capacitance value of the variable capacitor 100 when the maximum capacitance value is regarded as 1. CV characteristic 901 show the variation in the capacitance value of the variable capacitor 100 in the case where the potential of the second electrode 104 was fixed to 0 V and the potential of the first electrode 101 was varied from 8 V to −8 V.

It is found from the CV characteristic 901 that the substantially maximum capacitance value is stably obtained when the potential of the first electrode 101 is a positive potential. It is also found that a capacitance value which is about one third of the maximum capacitance value is stably obtained when the potential of the first electrode 101 is a negative potential.

An In—Ga—Zn-based oxide semiconductor becomes n-type when a positive electric field is applied thereto, but remains i-type, without formation of an inversion layer, even when a negative electric field is applied thereto. Therefore, the semiconductor layer 103 remains i-type while a negative electric field is applied thereto, regardless of the potential of the first electrode 101.

According to the calculation results, it was confirmed that a capacitance value corresponding to the ratio between the area C1 and the area C2 was able to be stably obtained with high controllability in the variable capacitor 100 in which an oxide semiconductor was used for the semiconductor layer.

Note that the calculation results in FIG. 17A were obtained in the case where a semiconductor which becomes n-type or i-type depending on an electric field applied thereto was used for the semiconductor layer 103; however, it is assumed that also in the case of using a semiconductor material which becomes p-type or i-type depending on an electric field applied thereto for the semiconductor layer 103, a tendency similar to that shown by the CV characteristic 901 is observed by interchanging the positive and negative polarities of the horizontal axis in FIG. 17A.

Figure 17B:
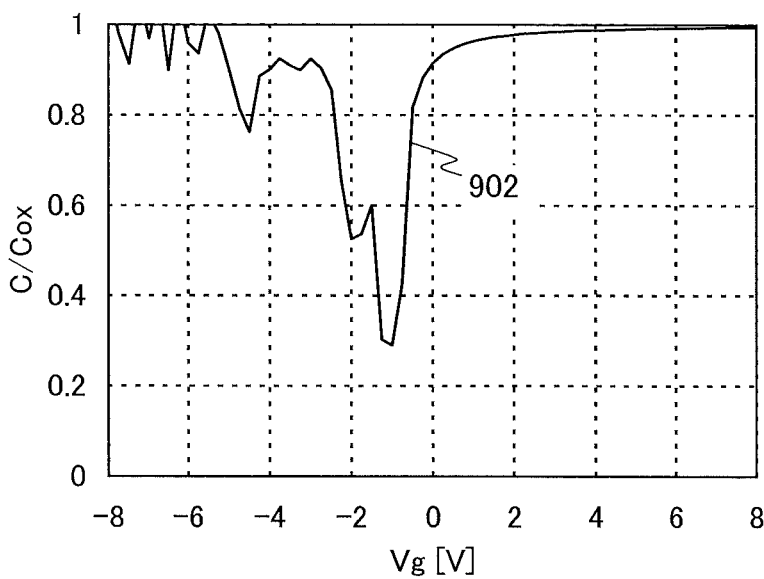

FIG. 17B shows calculation results of the variable capacitor 100 in which n-type silicon was used for the semiconductor layer 103. In the calculation, the band gap of the semiconductor layer 103 and the donor density in the n-type silicon were assumed to be 1.1 eV and $1 \times 10^{16}/cm^3$, respectively, and the other conditions were the same as those of the above.

In FIG. 17B, the horizontal axis represents the potential of the first electrode 101, and the vertical axis represents the capacitance value of the variable capacitor 100 when the maximum capacitance value is regarded as 1. CV characteristic 902 show the variation in the capacitance value of the variable capacitor 100 in the case where the potential of the second electrode 104 was fixed to 0 V and the potential of the first electrode 101 was varied from 8 V to −8 V.

It is found from the CV characteristic 902 that the substantially maximum capacitance value is stably obtained when the potential of the first electrode 101 is a positive potential. It is also found that the capacitance value obtained when the potential of the first electrode 101 is around −1 V is the minimum capacitance value, and as the potential of the first electrode 101 increases therefrom in a negative direction, the capacitance value increases again.

N-type silicon remains n-type while a positive electric field is applied thereto, but when a negative electric field is applied, a depletion layer is formed and then an inversion layer is formed in which the n-type silicon becomes p-type. N-type silicon and p-type silicon both function as conductors. Thus, when an inversion layer is formed, the capacitance value increases again.

According to the calculation results, it was confirmed that the variable capacitor 100 in which n-type silicon was used for the semiconductor layer 103 was easily affected by variation in the potential of the first electrode 101, and therefore had poor controllability of a capacitance value corresponding to the ratio between the area C1 and the area C2, so that different capacitance values were not able to be stably obtained.

Note that the calculation results shown in FIG. 17B were obtained in the case where n-type silicon was used for the semiconductor layer 103; however, it is assumed that in the case of using p-type silicon for the semiconductor layer 103, a tendency similar to that shown by the CV characteristic 902 is observed by interchanging the positive and negative polarities of the horizontal axis in FIG. 17B. Further, without limitation to silicon, it is assumed that a similar tendency is observed in the case of using a semiconductor material which becomes n-type or p-type depending on an electric field applied thereto for the semiconductor layer 103.

This application is based on Japanese Patent Application serial no. 2010-249074 filed with Japan Patent Office on Nov. 5, 2010, the entire contents of which are hereby incorporated by reference.

What is claimed is:

1. A capacitor comprising:
a substrate;
a first electrode over the substrate;
a second electrode over the substrate; and
an insulating layer and a thin film oxide semiconductor layer both interposed between the first electrode and the second electrode, the thin film oxide semiconductor layer being separated from the first electrode by the insulating layer and in ohmic contact with the second electrode,
wherein an area where the thin film oxide semiconductor layer and the first electrode overlap with each other is larger than an area where the first electrode, the thin film oxide semiconductor layer, and the second electrode overlap with one another,
wherein a top surface portion and a side surface portion of the thin film oxide semiconductor layer do not overlap with the second electrode,
wherein the thin film oxide semiconductor layer is of i-type or substantially i-type and has a carrier density lower than $1 \times 10^{12}/cm^3$.

2. The capacitor according to claim 1, wherein a work function of the second electrode is less than or equal to an electron affinity of the thin film oxide semiconductor layer.

3. The capacitor according to claim 1, wherein the thin film oxide semiconductor layer is in direct contact with the second electrode.

4. The capacitor according to claim 1, wherein the thin film oxide semiconductor layer comprises a C-Axis Aligned Crystal.

5. An electronic device including the capacitor according to claim 1.

6. A semiconductor device comprising:
a substrate;
an insulating layer over the substrate;
a thin film oxide semiconductor layer over the substrate;
a capacitor comprising:
a first electrode and a second electrode each over the substrate; and
a first portion of the insulating layer and a first portion of the thin film oxide semiconductor layer both interposed between the first electrode and the second electrode, the first portion of the thin film oxide semiconductor layer being separated from one of the first electrode and the second electrode by the first portion of the insulating layer and being in ohmic contact with the other one of the first electrode and the second electrode; and
a transistor comprising:
a gate;
a second portion of the insulating layer as a gate insulating layer;
a channel formation region comprising a second portion of the thin film oxide semiconductor layer; and
a source and a drain, one of the source and the drain being electrically connected to the second electrode of the capacitor,
wherein an area where the first portion of the thin film oxide semiconductor layer and the one of the first electrode and the second electrode overlap with each other is larger than an area where the first electrode, the first portion of the thin film oxide semiconductor layer, and the second electrode overlap with one another,
wherein a top surface portion and a side surface portion of the thin film oxide semiconductor layer do not overlap with the other one of the first electrode and the second electrode, and
wherein the thin film oxide semiconductor layer is of i-type or substantially i-type and has a carrier density lower than $1 \times 10^{12}/cm^3$.

7. The semiconductor device according to claim 6, wherein a work function of the other one of the first electrode and the second electrode is less than or equal to an electron affinity of the thin film oxide semiconductor layer.

8. The semiconductor device according to claim 6, wherein the thin film oxide semiconductor layer is in direct contact with the second electrode.

9. The semiconductor device according to claim 6, wherein the thin film oxide semiconductor layer comprises a C-Axis Aligned Crystal.

10. An electronic device including the semiconductor device according to claim 6.

11. A liquid crystal display device comprising:
a substrate;
an insulating layer over the substrate;
a thin film oxide semiconductor layer over the substrate;
a pixel comprising:
a transistor comprising a gate, a source and a drain each over the substrate;
a capacitor comprising:
a first electrode and a second electrode each over the substrate, the second electrode being electrically connected to one of the source and the drain of the transistor;
a first portion of the insulating layer and a first portion of the thin film oxide semiconductor layer both interposed between the first electrode and the second electrode, the first portion of the thin film oxide semiconductor layer being separated from one of the first electrode and the second electrode by the first portion of the insulating layer and being in ohmic contact with the other one of the first electrode and the second electrode; and
a liquid crystal element comprising a third electrode electrically connected to the second electrode of the capacitor;
a first driver circuit;
a first wiring electrically connected to the first driver circuit and to the gate of the transistor;
a second driver circuit;
a second wiring electrically connected to the second driver circuit and to the other of the source and the drain of the transistor;
a third driver circuit; and a third wiring electrically connected to the third driver circuit and to the first electrode of the variable capacitor, wherein the transistor comprises a second portion of the insulating layer as a gate insulating layer, wherein the transistor comprises a channel formation region comprising a second portion of the thin film oxide semiconductor layer, wherein an area where the first portion of the thin film oxide semiconductor layer and the one of the first electrode and the second electrode overlap with each other is larger than an area where the first electrode, the first portion of the thin film oxide semiconductor layer, and the second electrode overlap with one another, wherein a top surface portion and a side surface portion of the thin film oxide semiconductor layer do not overlap with the other one of the first electrode and the second electrode, and wherein the thin film oxide semiconductor layer is of i-type or substantially i-type and has a carrier density lower than $1\times10^{12}/cm^3$.

12. The liquid crystal display device according to claim 11, wherein the gate of the transistor and the first electrode of the capacitor are made of a same first conductive layer, and wherein the source, the drain, and the second electrode are made of a same second conductive layer.

13. The liquid crystal display device according to claim 11, wherein a work function of the other one of the first electrode and the second electrode is less than or equal to an electron affinity of the thin film oxide semiconductor layer.

14. The liquid crystal display device according to claim 11, wherein the thin film oxide semiconductor layer comprises a C-Axis Aligned Crystal.

15. An electronic device including the liquid crystal display device according to claim 11.

16. A liquid crystal display device comprising:
a substrate;
an insulating layer over the substrate;
a thin film oxide semiconductor layer over the substrate;
a pixel comprising:
  a transistor comprising a gate, a source, and a drain each over the substrate;
  a capacitor comprising:
    a first electrode and a second electrode each over the substrate, the second electrode being electrically connected to one of the source and the drain of the transistor;
    a first portion of the insulating layer and a first portion of the thin film oxide semiconductor layer both interposed between the first electrode and the second electrode, the first portion of the thin film oxide semiconductor layer being separated from one of the first electrode and the second electrode by the first portion of the insulating layer and being in ohmic contact with the other one of the first electrode and the second electrode; and
  a liquid crystal element comprising a third electrode electrically connected to the second electrode of the capacitor;
a memory circuit configured to store image signals corresponding to successive frame periods; and
a comparison circuit configured to compare the image signals corresponding to the successive frame periods;
wherein the liquid crystal display device is configured to apply a voltage to the first electrode of the capacitor in accordance with a result of a comparison between the image signals corresponding to the successive frame periods, wherein an area where the first portion of the thin film oxide semiconductor layer and the one of the first electrode and the second electrode overlap with each other is larger than an area where the first electrode, the first portion of the thin film oxide semiconductor layer, and the second electrode overlap with one another, wherein a top surface portion and a side surface portion of the thin film oxide semiconductor layer do not overlap with the other one of the first electrode and the second electrode, and wherein the thin film oxide semiconductor layer is of i-type or substantially i-type and has a carrier density lower than $1\times10^{12}/cm^3$.

17. The liquid crystal display device according to claim 16, wherein the transistor comprises a second portion of the insulating layer as a gate insulating layer, wherein the transistor comprises a channel formation region comprising a second portion of the thin film oxide semiconductor layer, wherein the gate of the transistor and the first electrode of the capacitor are made of a same first conductive layer, and wherein the source and the drain of the transistor and the second electrode of the capacitor are made a same second conductive layer.

18. The liquid crystal display device according to claim 16, wherein a work function of the other one of the first electrode and the second electrode is less than or equal to an electron affinity of the thin film oxide semiconductor layer.

19. The liquid crystal display device according to claim 16, wherein the thin film oxide semiconductor layer comprises a C-Axis Aligned Crystal.

20. An electronic device including the liquid crystal display device according to claim 16.

21. The capacitor according to claim 1, wherein the first electrode, the second electrode, the insulating layer and the thin film oxide semiconductor layer are made of planar layers formed on top of each other.

22. The semiconductor device according to claim 6, wherein the first electrode, the second electrode, the first portion of the insulating layer and the first portion of the thin film oxide semiconductor layer are made of planar layers formed on top of each other.

23. The liquid crystal display device according to claim 11, wherein the first electrode, the second electrode, the insulating layer and the first portion of the thin film oxide semiconductor layer are made of planar layers formed on top of each other.

24. The liquid crystal display device according to claim 16, wherein the first electrode, the second electrode, the insulating layer and the first portion of the thin film oxide semiconductor layer are made of planar layers formed on top of each other.

25. The capacitor according to claim 1, wherein the carrier density of the thin film oxide semiconductor layer is lower than $1.45\times10^{10}/cm^3$.

26. The semiconductor device according to claim 6, wherein the carrier density of the thin film oxide semiconductor layer is lower than $1.45\times10^{10}/cm^3$.

27. The liquid crystal display device according to claim 11, wherein the carrier density of the thin film oxide semiconductor layer is lower than $1.45\times10^{10}/cm^3$.

28. The liquid crystal display device according to claim 16, wherein the carrier density of the thin film oxide semiconductor layer is lower than $1.45 \times 10^{10}/cm^3$.

29. The semiconductor device according to claim 6,
wherein the first electrode and the gate are made of a same first conductive film, and
wherein the second electrode and the one of the source and the drain are made of a same second conductive layer.

30. The semiconductor device according to claim 6, wherein the gate is interposed between the substrate and the second portion of the thin film oxide semiconductor layer.

31. The liquid crystal display device according to claim 11, wherein the gate is interposed between the substrate and the second portion of the thin film oxide semiconductor layer.

32. The liquid crystal display device according to claim 16, wherein the gate is interposed between the substrate and a channel formation region of the transistor.

33. The liquid crystal display device according to claim 16, wherein the voltage applied to the first electrode of the capacitor depends on which of a still image and a moving image is to be displayed as judged by the comparison circuit.

34. The capacitor according to claim 1, wherein the capacitor is a variable capacitor.

35. The semiconductor device according to claim 6, wherein the capacitor is a variable capacitor.

36. The liquid crystal display device according to claim 11, wherein the capacitor is a variable capacitor.

37. The liquid crystal display device according to claim 16, wherein the capacitor is a variable capacitor.

* * * * *

UNITED STATES PATENT AND TRADEMARK OFFICE
CERTIFICATE OF CORRECTION

Page 1 of 1

PATENT NO. : 8,957,468 B2
APPLICATION NO. : 13/285367
DATED : February 17, 2015
INVENTOR(S) : Hideki Uochi It is certified that error appears in the above-identified patent and that said Letters Patent is hereby corrected as shown below:

Specification

Column 7, line 38, after "manner" insert --:--;

Column 10, line 5, after "G" replace ";" with --,--;

Column 10, line 5, after "(R," insert --G,--;

Column 10, line 7, after "R," insert --G,--;

Column 10, line 19, replace "in" with --$m$--;

Column 16, line 45, replace "2244" with --224--;

Column 28, line 39, replace "Mimed" with --formed--;

Column 39, line 61, replace "1001n" with --100 in--; and

Claims

Column 43, line 2, claim 11, after "of the" delete "variable".

Signed and Sealed this
Twenty-seventh Day of October, 2015

Michelle K. Lee
*Director of the United States Patent and Trademark Office*